United States Patent
Huai et al.

(10) Patent No.: US 7,518,835 B2
(45) Date of Patent: Apr. 14, 2009

(54) MAGNETIC ELEMENTS HAVING A BIAS FIELD AND MAGNETIC MEMORY DEVICES USING THE MAGNETIC ELEMENTS

(75) Inventors: Yiming Huai, Pleasanton, CA (US); Dmytro Apalkov, Milpitas, CA (US)

(73) Assignee: Grandis, Inc., Milpitas, CA (US)

( * ) Notice: Subject to any disclaimer, the term of this patent is extended or adjusted under 35 U.S.C. 154(b) by 438 days.

(21) Appl. No.: 11/173,087

(22) Filed: Jul. 1, 2005

(65) Prior Publication Data

US 2007/0002504 A1    Jan. 4, 2007

(51) Int. Cl.
    *G11B 5/39* (2006.01)
(52) U.S. Cl. .................................. 360/324.12
(58) Field of Classification Search ............. 360/324.12
    See application file for complete search history.

(56) References Cited

U.S. PATENT DOCUMENTS

| | | | |
|---|---|---|---|
| 6,097,579 A | 8/2000 | Gill | 360/324.2 |
| 6,438,026 B2 | 8/2002 | Gillies et al. | 365/158 |
| 6,466,419 B1 * | 10/2002 | Mao | 360/324.12 |
| 6,836,392 B2 | 12/2004 | Carey et al. | 360/324.11 |
| 7,218,488 B2 * | 5/2007 | Gill | 360/324.12 |
| 7,245,463 B2 * | 7/2007 | Gill | 360/324.12 |
| 7,256,971 B2 * | 8/2007 | Horng et al. | 360/324.11 |
| 7,280,324 B2 * | 10/2007 | Gill | 360/324.12 |

* cited by examiner

*Primary Examiner*—Mark Blouin
(74) *Attorney, Agent, or Firm*—Strategic Patent Group, P.C

(57) ABSTRACT

A method and system for providing a magnetic element are disclosed. The method and system include providing a magnetic biasing structure having a first pinned layer, a second pinned layer, a spacer layer, and a free layer. The first pinned layer has a first magnetization pinned in the first direction. The second pinned layer has a second magnetization in a second direction that is substantially perpendicular or along the first direction. The spacer layer is nonferromagnetic, resides between the second pinned layer and the free layer, and is configured such that the free layer is substantially free of exchange coupling with the second pinned layer. The free layer has a shape anisotropy with a longitudinal direction substantially in the second direction. The magnetic biasing structure provides a bias field for the free layer along the hard or easy axis. In one aspect, the second pinned layer resides between the first pinned layer and the free layer.

23 Claims, 14 Drawing Sheets

MAGNETIC ELEMENTS HAVING A BIAS FIELD AND MAGNETIC MEMORY DEVICES USING THE MAGNETIC ELEMENTS

FIELD OF THE INVENTION

The present invention relates to magnetic memory systems, and more particularly to a method and system for providing a magnetic element having a low write field, improved switching characteristics, and which is suitable for use in a magnetic memory such as a magnetic random access memory (MRAM).

BACKGROUND OF THE INVENTION

FIGS. 1A and 1B depict conventional magnetic elements 10 and 10'. Such conventional magnetic elements 10/10' can be used in non-volatile memories, such as MRAM. The conventional magnetic element 10 is a spin valve and includes a conventional antiferromagnetic (AFM) layer 12, a conventional pinned layer 14, a conventional nonmagnetic spacer layer 16 and a conventional free layer 18. Other layers (not shown), such as seed or capping layer may also be used. The conventional pinned layer 14 and the conventional free layer 18 are ferromagnetic. Thus, the conventional free layer 18 is depicted as having a changeable magnetization 19. The conventional nonmagnetic spacer layer 16 is conductive. The AFM layer 12 is used to fix, or pin, the magnetization of the pinned layer 14 in a particular direction. The magnetization of the free layer 18 is free to rotate, typically in response to an external magnetic field. The conventional magnetic element 10' depicted in FIG. 1B is a spin tunneling junction. Portions of the conventional spin tunneling junction 10' are analogous to the conventional spin valve 10. However, the conventional barrier layer 16' is an insulator that is thin enough for electrons to tunnel through in a conventional spin tunneling junction 10'. Note that only a single spin valve 10 is depicted, one of ordinary skill in the art will readily recognize that dual spin valves including two pinned layers and two nonmagnetic layers separating the pinned layers from the free layer can be used. Similarly, although only a single spin tunneling junction 10' is depicted, one of ordinary skill in the art will readily recognize that dual spin tunneling including two pinned layers and two barrier layers separating the pinned layers from the free layer, can be used. More recently, structures having two pinned layers and two layers, one barrier and one conductive, separating the pinned layers from the free layers have been developed, particularly for use when exploiting spin transfer in programming.

Depending upon the orientations of the magnetization 19/19' of the conventional free layer 18/18' and the conventional pinned layer 14/14', respectively, the resistance of the conventional magnetic element 10/10', respectively, changes. When the magnetization 19/19' of the conventional free layer 18/18' is parallel to the magnetization of the conventional pinned layer 14/14', the resistance of the conventional magnetic element 10/10' is low. When the magnetization 19/19' of the conventional free layer 18/18' is antiparallel to the magnetization of the conventional pinned layer 14/14', the resistance of the conventional magnetic element 10/10' is high.

To sense the resistance of the conventional magnetic element 10/10', current is driven through the conventional magnetic element 10/10'. Typically in memory applications, current is driven in a CPP (current perpendicular to the plane) configuration, perpendicular to the layers of conventional magnetic element 10/10' (up or down, in the z-direction as seen in FIG. 1A or 1B). Based upon the change in resistance, typically measured using the magnitude of the voltage drop across the conventional magnetic element 10/10', the resistance state and, therefore, the data stored in the conventional magnetic element 10/10' can be determined.

In conventional MRAM, the conventional magnetic element 10/10' is written using an in-plane magnetic field that is approximately forty-five degrees from the axis in which the magnetization 19/19' lie. This magnetic field is typically provided by driving current through two write lines (not shown) which are oriented perpendicular and which cross in the region of the conventional magnetic element 10/10'. Depending upon the direction of the magnetic field, the magnetization 19/19' of the free layer 18/18' can be switched to have an equilibrium position parallel or antiparallel to the magnetization of the pinned layer 14/14'.

Although the conventional magnetic elements 10/10' can be used to store data in an MRAM, one of ordinary skill in the art will readily recognize that there are a number of drawbacks. Of these, the primary issues include poor write selectivity and a high write current required to write to the conventional magnetic elements 10/10'. Typically, a magnetic cell includes the conventional magnetic element 10/10' and other element(s), such as a selection transistor. Poor write selectivity results in memory cells in addition to the desired memory cell being written. These unintentionally written cells are typically adjacent to the memory cell desired to be written. During manufacturing, defects may be introduced into elements within the memory cells. Manufacturing also results in variations in the size and shape of the conventional magnetic elements 10/10', as well as other portions of the memory cell. The defects and variations in the memory cell size and shape cause variations in the internal demagnetizing field. The magnetic field produced within the memory cell (internal magnetic field), which includes the demagnetizing field and the applied field at the memory cell, may vary widely from cell to cell. The variations in the internal magnetic field mean that the magnetic field required to write a particular magnetic cell (required write field) varies from cell to cell. Variations in the required write field mean that neighboring cells may be affected by the magnetic field applied to write to a particular cell. Consequently, unintentional cell writing of neighboring cells may occur. Thus, defects and variations in the memory cell size and shape may result in a large distribution in the required write field and unintentional cell writing for neighboring cells.

Writing to conventional magnetic cells may also require a larger write current, which is undesirable. As discussed above, there is large distribution in the required write field. Consequently, a higher applied magnetic field is often generated to ensure that the desired memory cells are written. A higher applied magnetic field requires a higher current to be driven through the write lines. This higher current is undesirable, for example due to increased power consumption. In addition, the possibility of unintentional cell writing may be increased by the higher magnetic field.

Accordingly, what is needed is a system and method for providing a magnetic memory element that can be switched using a lower current and that has improved switching characteristics. The present invention addresses such a need.

BRIEF SUMMARY OF THE INVENTION

The present invention provides a method and system for providing a magnetic element. In one aspect, the method and system comprise providing a magnetic biasing structure that includes a first pinned layer, providing a second pinned layer, providing a spacer layer, and providing a free layer. The first pinned layer has a first pinned layer magnetization pinned in a first direction. The second pinned layer has a second pinned layer magnetization oriented in a second direction that is substantially perpendicular to the first direction or substantially along the first direction. The second pinned layer also resides between the first pinned layer and the free layer. The spacer layer is nonferromagnetic. The spacer layer resides between the second pinned layer and the free layer and is configured such that the free layer is substantially free of exchange coupling with the second pinned layer. The free layer has an anisotropy with a longitudinal direction substantially parallel to the second direction. The magnetic biasing structure is for providing a hard axis bias field for the free layer along the first direction if the second direction is perpendicular to the first direction or an easy axis bias field for the free layer along the second direction if the second direction is along the first direction.

In another aspect, the method and system include providing a magnetic biasing structure including a first pinned layer and a first pinning layer, providing a first spacer layer, providing a free layer, providing a second spacer layer, providing a second pinned layer, and providing a second pinning layer. The first and second spacer layers are nonferromagnetic. The first spacer layer resides between the first pinned layer and the free layer. The first pinning layer has a first blocking temperature. The second pinned layer has a second pinned layer magnetization pinned in a second direction substantially perpendicular to the first direction or substantially along the first direction. The second spacer layer is configured such that the free layer is substantially free of exchange coupling with the second pinned layer. The free layer has an anisotropy with a longitudinal direction substantially parallel to the second direction. The magnetic biasing structure provides a hard axis bias field for the free layer in the first direction if the second direction is perpendicular to the first direction or an easy axis bias field for the free layer in the second direction if the second direction is along the first direction. The second pinning layer is adjacent to the second pinned layer, pins the second pinned magnetization in the second direction and has a second blocking temperature different from the first blocking temperature.

According to the method and system disclosed herein, the present invention provides a magnetic element having improved switching characteristics and that can be written using a lower current.

DETAILED DESCRIPTION OF THE INVENTION

Figure 1A:
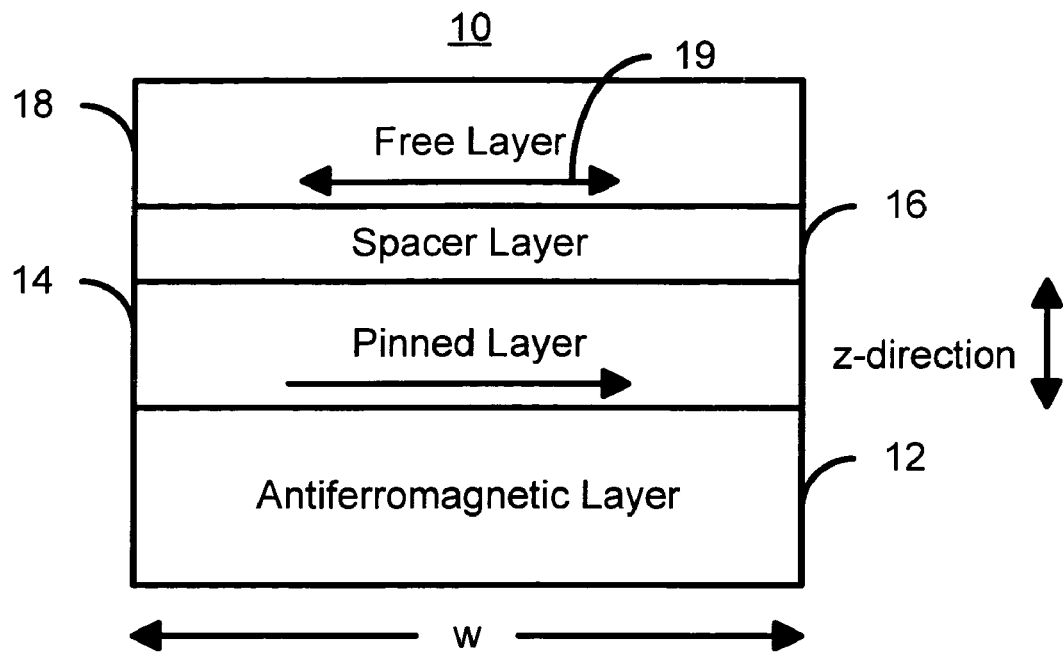
FIG. 1A is a diagram of a conventional magnetic element, a spin valve.
Figure 1B:
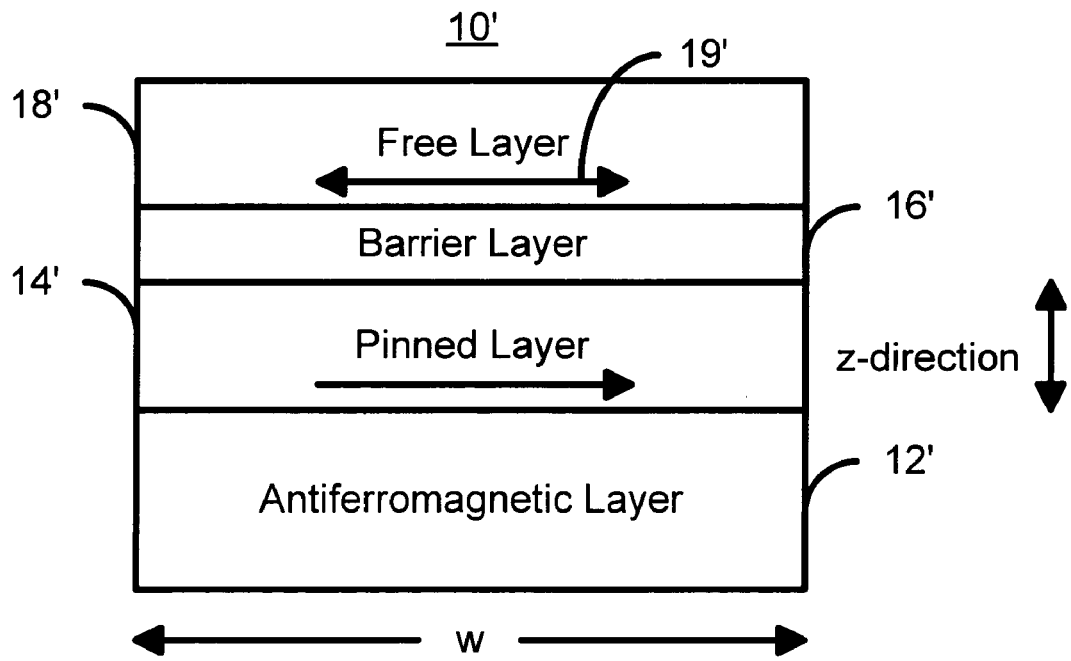
FIG. 1B is a diagram of another conventional magnetic element, a spin tunneling junction.

The present invention relates to magnetic elements and magnetic memories such as MRAM. The following description is presented to enable one of ordinary skill in the art to make and use the invention and is provided in the context of a patent application and its requirements. Various modifications to the preferred embodiments and the generic principles and features described herein will be readily apparent to those skilled in the art. Thus, the present invention is not intended to be limited to the embodiments shown, but is to be accorded the widest scope consistent with the principles and features described herein. The present invention is also described in the context of current knowledge for physical phenomenon. However, the present invention is not intended to be limited to specific explanations of physical phenomenon.

The present invention provides a method and system for providing a magnetic element. The method and system comprise providing a magnetic biasing structure having a first pinned layer, providing a second pinned layer, providing a spacer layer, and providing a free layer. The first pinned layer has a first pinned layer magnetization pinned in a first direction. The second pinned layer has a second pinned layer magnetization oriented in a second direction that is substantially perpendicular to the first direction or substantially along the first direction. The spacer layer is nonferromagnetic. The spacer layer resides between the second pinned layer and the free layer and is configured such that the free layer is substantially free of exchange coupling with the second pinned layer. The free layer has an anisotropy with a longitudinal direction substantially parallel to the second direction. The magnetic biasing structure is for providing a hard axis bias field for the free layer along the first direction if the second direction is perpendicular to the first direction or an easy axis bias field along the second direction if the second direction is along the first direction. In one aspect, the second pinned layer resides between the first pinned layer and the free layer.

In another aspect, the method and system include providing a magnetic biasing structure including a first pinned layer and a first pinning layer, providing a first spacer layer, providing a free layer, providing a second spacer layer, providing a second pinned layer, and providing a second pinning layer. The first and second spacer layers are nonferromagnetic. The first spacer layer resides between the first pinned layer and the free layer. The first pinning layer has a first blocking temperature. The second pinned layer has a second pinned layer magnetization pinned in a second direction substantially perpendicular to the first direction or substantially along the first direction. The second spacer layer is configured such that the free layer is substantially free of exchange coupling with the second pinned layer. The free layer has an anisotropy with a longitudinal direction substantially parallel to the second direction. The magnetic biasing structure provides a hard axis bias field for the free layer along the first direction if the second direction is perpendicular to the first direction or an easy axis bias field along the second direction if the second direction is along the first direction. The second pinning layer is adjacent to the second pinned layer, pins the second pinned magnetization in the second direction and has a second blocking temperature that might be different from the first blocking temperature.

The present invention will be described in terms of a particular magnetic memory and a particular magnetic element having certain components. However, one of ordinary skill in the art will readily recognize that this method and system will operate effectively for other magnetic memory elements having different and/or additional components and/or other magnetic memories having different and/or other features and/or shapes not inconsistent with the present invention. One of ordinary skill in the art will also readily recognize that the method and system are described in the context of a structure having a particular relationship to the substrate. However, one of ordinary skill in the art will readily recognize that the method and system are consistent with other structures. In addition, the method and system are described in the context of certain layers being synthetic and/or simple. However, one of ordinary skill in the art will readily recognize that the layers could have another structure. Furthermore, the present invention is described in the context of magnetic elements having particular layers. However, one of ordinary skill in the art will readily recognize that magnetic elements having additional and/or different layers not inconsistent with the present invention could also be used. Moreover, certain components are described as being ferromagnetic or magnetic. However, as used herein, the term ferromagnetic or magnetic could include ferrimagnetic or like structures. Thus, as used herein, the term "ferromagnetic" includes, but is not limited to ferromagnets and ferrimagnets. The present invention is also described in the context of simple layers. However, one of ordinary skill in the art will readily recognize that the present invention is consistent with the use of synthetic layers, for example composed of ferromagnetic layers separated by conductive nonmagnetic layer(s). One of ordinary skill in the art will also recognize that the magnetizations of the ferromagnetic layers in such synthetic layers may or may not be balanced (equal and opposite). The present invention is also described in the context of specific directions, for example for the applied field and magnetic bias. However, one of ordinary skill in the art will readily see that other combinations of directions may be used for the applied magnetic field.

Figure 2:
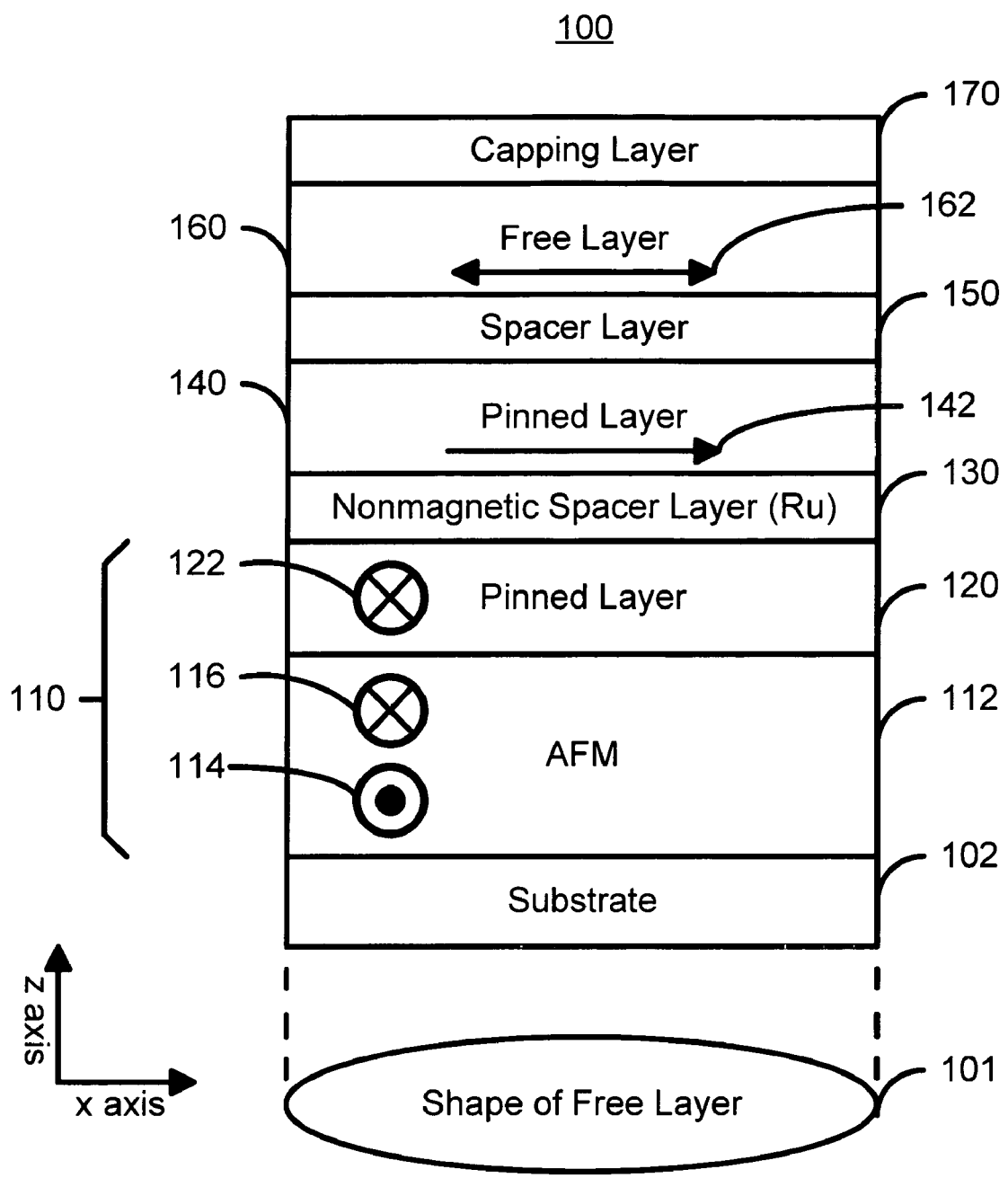
FIG. 2 is a diagram of one embodiment of a magnetic element in accordance with the present invention having improved switching characteristics.

To more particularly describe the present invention, refer to FIG. 2, which is a diagram of one embodiment of a magnetic element 100 in accordance with the present invention having improved switching characteristics. The magnetic element has a shape 101 having a longitudinal axis in the x direction, and a transverse axis in the y direction (out of the plane of the page). The shape 101 is preferably elliptical, but may vary. The magnetic element 100 includes magnetic bias structure 110 formed on a substrate 102, nonmagnetic spacer layer 130, pinned layer 140, spacer layer 150, free layer 160, and capping layer 170.

The magnetic bias structure 110 includes a pinning layer 112 and a pinned layer 120. The pinning layer 112 is preferably an AFM layer having sublattices 114 and 116 that are antiparallel. The pinned layer 120 is a ferromagnetic layer having a magnetization 122 in a first direction. In a preferred embodiment, the pinned layer 120 includes a CoFe alloy, Co, Permalloy, or other materials having similar parameters. The direction of the magnetization 122 is strongly coupled, or pinned, by the pinning layer 112, preferably through an exchange bias. The nonmagnetic spacer layer 130 separates the pinned layer 120 from the pinned layer 140. In a preferred embodiment, the nonmagnetic spacer layer 130 is composed of Cr, Mn, Ir, Ru or other materials having similar characteristics. The pinned layer 140 is ferromagnetic and preferably includes a CoFe alloy, Co, Permalloy, or other materials having similar parameters. The thickness of the nonmagnetic spacer layer 130 is preferably selected such that the pinned layers 120 and 140 are magnetically coupled. In particular, the thickness and composition of the nonmagnetic spacer layer 130 are chosen such that the magnetizations 122 and 142 of the pinned layers 120 and 140, respectively, are magnetically coupled and such that the magnetization 142 of the pinned layer 140 is substantially perpendicular to the magnetization 122 of the pinned layer 120.

The spacer layer 150 may, for example, be a conductor such as Cu or may be an insulator, such as alumina. If insulating, the spacer layer 150 is preferably a tunneling barrier layer, which allows tunneling of electrons between the free layer 160 and the pinned layer 140. The spacer layer 150 is also configured such that the free layer 160 is not exchange coupled to the pinned layer 140. In particular, the spacer layer 150 is made sufficiently thick to essentially eliminate magnetic coupling, such as exchange coupling, across the spacer layer 150.

The free layer 160 is ferromagnetic. In a preferred embodiment, the free layer 160 includes a CoFe alloy, Co, Permalloy, or other materials having similar parameters. In addition, as discussed above, the free layer 160 is not exchange coupled with the pinned layer 140. However, because of the shape 101 of the free layer 160, at equilibrium (zero applied field), the magnetization 162 of the free layer 160 lies substantially along the longitudinal axis. Stated differently, the free layer 160 has an anisotropy (shape anisotropy here) that results in an easy axis (the longitudinal axis, or x axis, here). At equilibrium the magnetization 162 of the free layer 160 is substantially along this easy axis, either parallel or antiparallel to the magnetization 142 of the pinned layer 140. The direction of the magnetization 162 of the free layer 160 may be switched by providing an applied (external) field along the x axis or a combination of fields along the x and y axes. Furthermore, the free layer 160 is subject to a hard axis bias field along the y axis (perpendicular to the plane of the page in FIG. 2) due to the magnetic bias structure 10. Because of the application of this hard axis bias field, switching characteristics may be improved and write current reduced, as discussed below.

Figure 3:
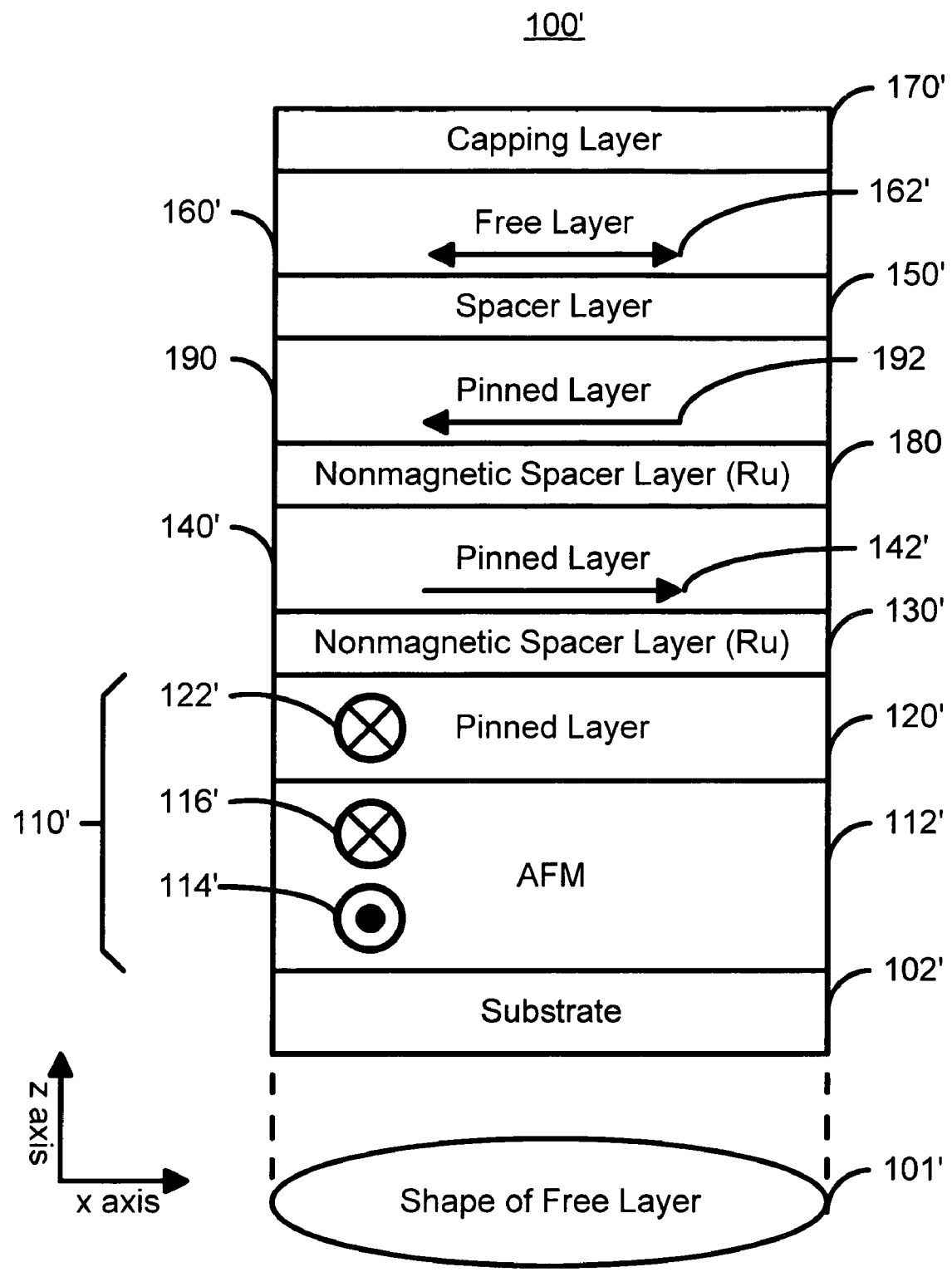
FIG. 3 is a diagram of another embodiment of a magnetic element in accordance with the present invention having improved switching characteristics.

FIG. 3 is a diagram of another embodiment of a magnetic element 100' in accordance with the present invention having improved switching characteristics. The magnetic element 100' is analogous to the magnetic element 100. Consequently, analogous portions of the magnetic element 100' are labeled similarly. The magnetic element 100' has a shape 101' having a longitudinal axis in the x direction, and a transverse axis in the y direction (out of the plane of the page). The shape 101' is preferably elliptical, but may vary. Thus, the magnetic element 100' has an anisotropy and a corresponding easy axis. The magnetic element 100' includes magnetic bias structure 110' formed on a substrate 102', nonmagnetic spacer layer 130', pinned layer 140', an additional nonmagnetic spacer layer 180, a third pinned layer 190, a spacer layer 150', free layer 160', and capping layer 170'.

The magnetic bias structure 110' includes a pinning layer 112' and a pinned layer 120'. The pinning layer 112' is preferably an AFM layer having sublattices 114' and 116' that are antiparallel. The pinned layer 120' is a ferromagnetic layer having a magnetization 122' in a first direction. In a preferred embodiment, the pinned layer 120' includes a CoFe alloy, Co, Permalloy, or other materials having similar parameters. The direction of the magnetization 122' is strongly coupled, or pinned, by the pinning layer 112', preferably through an exchange bias.

The nonmagnetic spacer layers 130' and 180 separate the pinned layers 120' and 140', respectively, from the pinned layer 140' and 190, respectively. In a preferred embodiment, the nonmagnetic spacer layers 130' and 180 are each composed of Ru. The pinned layers 140' and 190 are each ferromagnetic and preferably include a CoFe alloy, Co, Permalloy, or other materials having similar parameters. The thickness of the nonmagnetic spacer layers 130' and 180 are preferably selected such that the pinned layers 120' and 140' and the pinned layers 140' and 190 are magnetically coupled. In particular, the thickness of the nonmagnetic spacer layer 130' is chosen such that the magnetizations 122' and 142' of the pinned layers 120' and 140', respectively, are magnetically coupled and such that the magnetization 142' of the pinned layer 140' is substantially perpendicular to the magnetization 122' of the pinned layer 120'. Similarly, the thickness of the nonmagnetic spacer layer 180 is chosen such that the magnetizations 142' and 192 of the pinned layers 140' and 190, respectively, are antiferromagnetically aligned and such that the magnetization 142' of the pinned layer 140' is substantially antiparallel to the magnetization 192 of the pinned layer 190. Thus, by varying the thicknesses of the nonmagnetic spacer layers 130' and 180, the desired directions of magnetization 142' and 192 may be achieved.

The spacer layer 150' may, for example, be a conductor such as Cu or may be an insulator, such as alumina. If insulating, the spacer layer 150' is preferably a tunneling barrier layer, which allows tunneling of electrons between the free layer 160' and the pinned layer 190. The spacer layer 150' is also configured such that the free layer 160' is not exchange coupled to the pinned layer 190 or to the pinned layer 140'. In particular, the spacer layer 150' is made sufficiently thick or smooth to essentially eliminate exchange coupling across the spacer layer 150'.

The free layer 160' is ferromagnetic. In a preferred embodiment, the free layer 160' includes a CoFe alloy, Co, Permalloy, or other materials having similar parameters. In addition, as discussed above, the free layer 160' is not magnetically coupled with the pinned layers 140' and 190. However, because of the shape 101' of the free layer 160', at equilibrium (zero applied field), the magnetization 162' of the free layer 160' lies substantially along the longitudinal axis. Stated differently, at equilibrium the magnetization 162' of the free layer 160' is substantially along the x axis, either parallel or antiparallel to the magnetizations 142' and 192 of the pinned layers 140' and 190, respectively. The direction of the magnetization 162' of the free layer 160' may be switched by providing an applied (external) field along the x axis or a combination of fields along the x and y axes. Furthermore, the free layer 160' is subject to a hard axis bias field along the y axis (perpendicular to the plane of the page in FIG. 3) due to the magnetic bias structure 110'. Because of the application of the hard axis bias field, switching characteristics may be improved and write current reduced, as discussed below.

Figure 4:
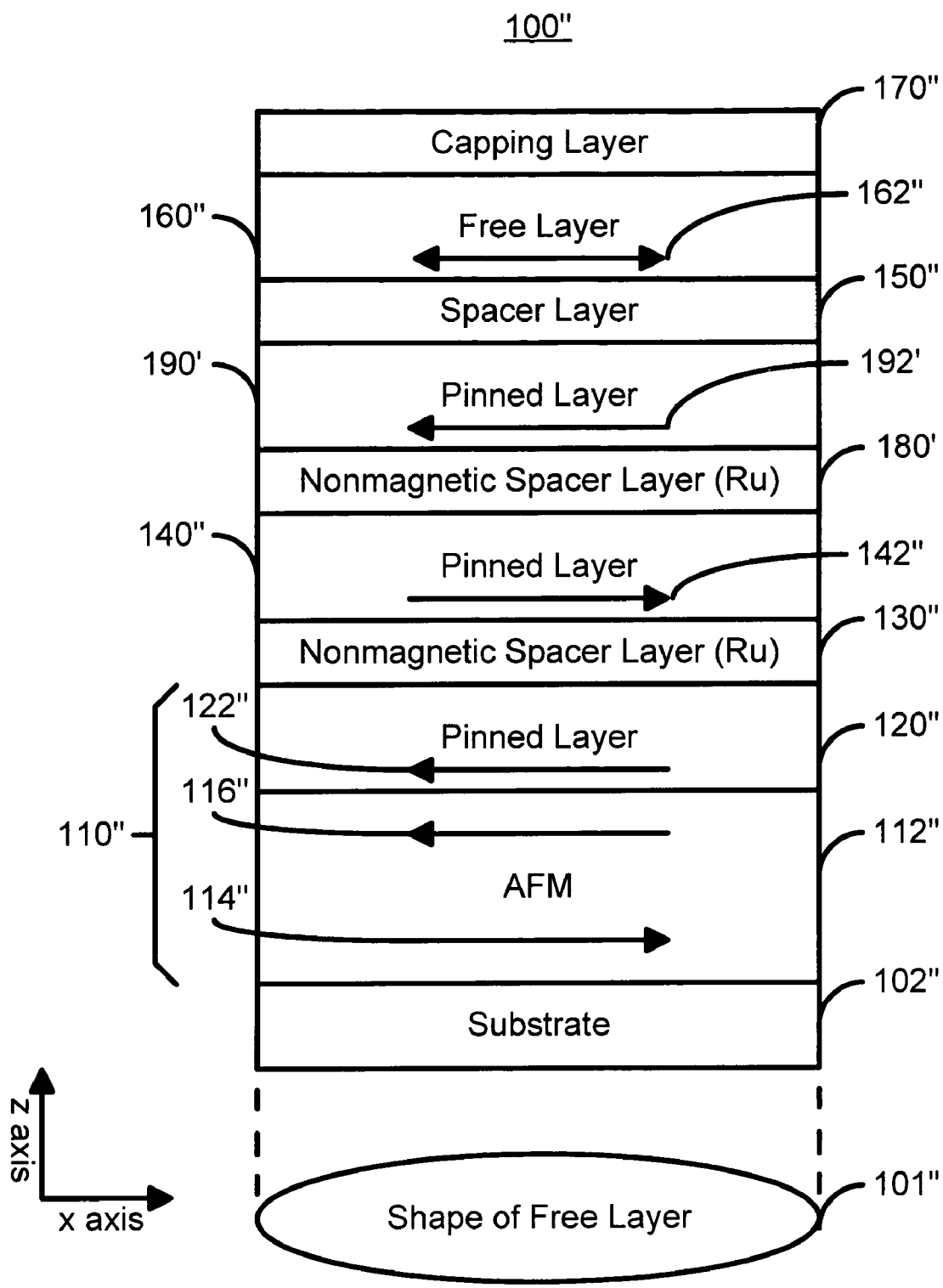
FIG. 4 is a diagram of another embodiment of a magnetic element in accordance with the present invention having improved switching characteristics.

FIG. 4 is a diagram of another embodiment of a magnetic element 100" in accordance with the present invention having improved switching characteristics. The magnetic element 100" is analogous to the magnetic element 100'. Consequently, analogous portions of the magnetic element 100" are labeled similarly. The magnetic element 100" has a shape 101" having a longitudinal axis in the x direction, and a transverse axis in the y direction (out of the plane of the page). The shape 101" is preferably elliptical, but may vary. Thus, the magnetic element 100" has an anisotropy and a corresponding easy axis. The magnetic element 100" includes magnetic bias structure 110" formed on a substrate 102", nonmagnetic spacer layer 130", pinned layer 140", an additional nonmagnetic spacer layer 180', a third pinned layer 190', a spacer layer 150", free layer 160", and capping layer 170".

The magnetic element 100" has a structure that is analogous to the magnetic element 100'. In addition, as with the magnetic element 100", the free layer 160" is substantially free of exchange coupling with the pinned layers 190' and 140". However, the bias structure 110" provides a magnetic bias for the free layer 160" that is along the easy (longitudinal) axis of the magnetic element 100" (e.g. parallel or antiparallel to the magnetization 142"), rather than along the hard axis. Thus, the magnetic element 100" is preferably used for magnetic memories in which toggle writing is to be employed. Consequently, the magnetic element 100" may still have improved switching characteristics and may be switched at a lower write current.

Figure 5:
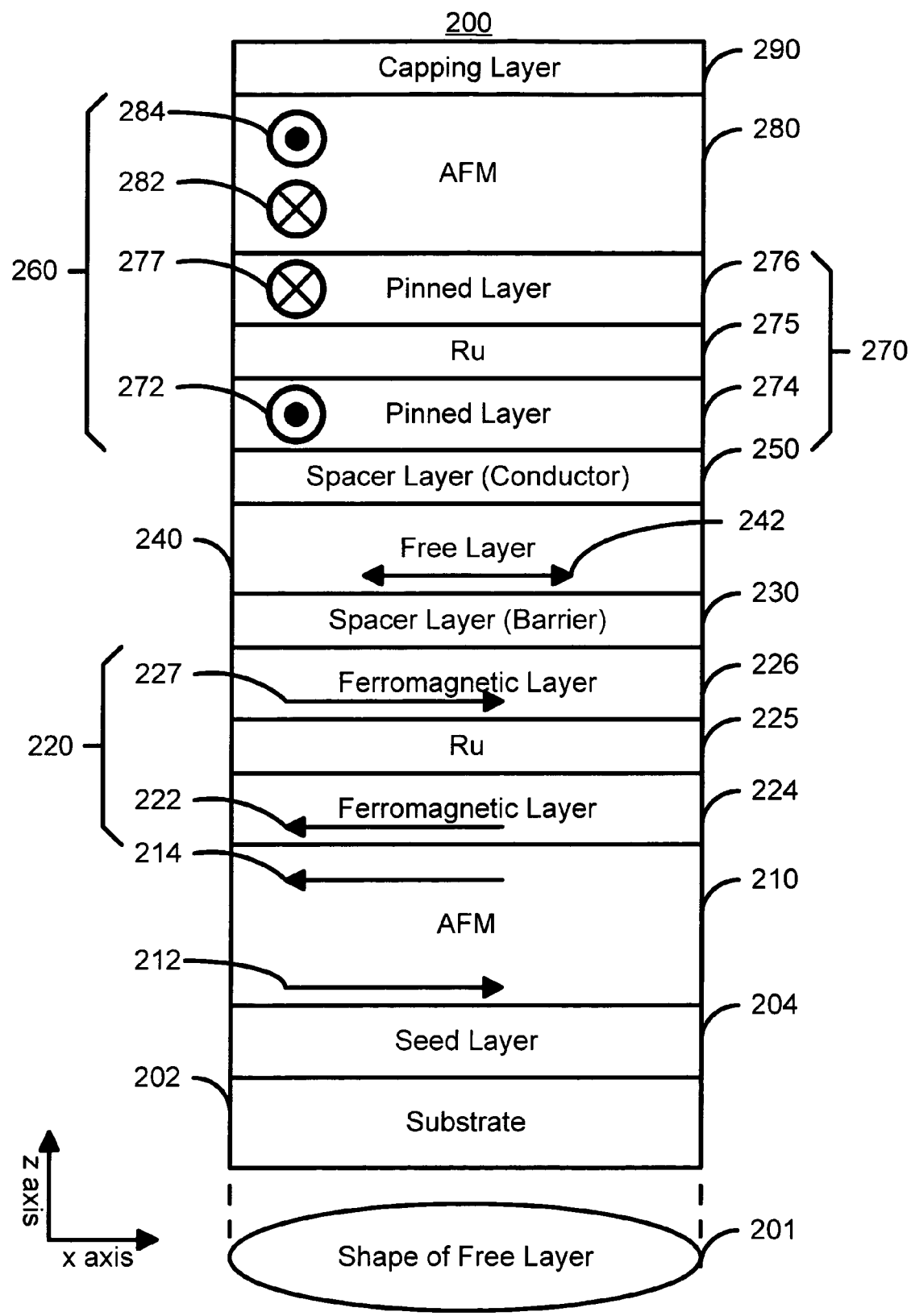
FIG. 5 is a diagram of another embodiment of a magnetic element in accordance with the present invention having improved switching characteristics.

FIG. 5 is a diagram of another embodiment of a magnetic element 200 in accordance with the present invention having improved switching characteristics. The magnetic element 200 has a shape 201 having a longitudinal axis in the x direction, and a transverse axis in the y direction (out of the plane of the page). The shape 201 is preferably elliptical, but may vary. The magnetic element 200 residing on the substrate 202 includes a seed layer 204, a pinning layer 210 that is preferably an AFM layer, pinned layer 220, spacer layer 230 that is preferably a tunneling barrier layer, a free layer 240, a spacer layer 250 that may be conductive or a tunneling barrier layer, a magnetic bias structure 260, and capping layer 290.

The magnetic bias structure 260 includes a pinning layer 280 and a pinned layer 270. The pinning layer 280 is preferably an AFM layer having sublattices 282 and 284 that are antiparallel. In a preferred embodiment, the pinning layer 280 is a layer of IrMn. The pinned layer 270 is a synthetic pinned layer having ferromagnetic layers 274 and 276 separated by a nonmagnetic conductive preferably Ru layer 275. The ferromagnetic layer 274 has a magnetization 272 in a first direction, while the ferromagnetic layer 276 has a magnetization 277 in an opposite direction. In a preferred embodiment, the pinned layer 270 includes a CoFe alloy, Co, Permalloy, or other materials having similar parameters. The direction of the magnetization 277 is strongly coupled, or pinned, by the pinning layer 280, preferably through an exchange bias. In alternate embodiments the pinned layer 270 may be a simple pinned layer.

The pinning layer 210 has sublattices 212 and 214 that are in a second direction, substantially perpendicular to the direction of the sublattices 282 and 284 of the pinning layer 280. In one embodiment, the pinning layer 210 has a blocking temperature that is different from the blocking temperature of the pinning layer 280. Stated differently, the pinning layers 210 and 280 become magnetically ordered at different temperatures. Consequently, fabrication of two separate pinning layers 210 and 280 oriented in different directions may be simplified. However, in another embodiment, the pinning layers 210 and 280 may have the same blocking temperature.

The pinned layer 220 is preferably a synthetic pinned layer including ferromagnetic layers 224 and 226 separated by a nonmagnetic conductive layer 225 that is preferably Ru. Due to the pinning layer 210, the pinned layer 224 has a magnetization 222 that is perpendicular to the magnetization 272 of the pinned layer 270. Because of the magnetic coupling between the ferromagnetic layers 224 and 226, the magnetization 227 of the ferromagnetic layer 226 is preferably aligned antiparallel to the magnetization 222 of the ferromagnetic layer 224. In a preferred embodiment, the ferromagnetic layers 224 and 226 include a CoFe alloy, Co, Permalloy, or other materials having similar parameters. In alternate embodiment(s), the pinned layer 220 may be a single pinned layer.

The spacer layer 230 is preferably a tunneling barrier layer and may, for example, be alumina. The spacer layer 230 is also configured such that the free layer 240 is not magnetically coupled to the pinned layer 220. In particular, the spacer layer 230 is made sufficiently thick or smooth to essentially eliminate exchange coupling across the spacer layer 230. The spacer layer 250 is preferably a conductor, such as Cu.

The free layer 240 is ferromagnetic. In a preferred embodiment, the free layer 240 includes a CoFe alloy, Co, Permalloy, or other materials having similar parameters. In addition, as discussed above, the free layer 240 is not magnetically coupled with the pinned layer 220. However, because of the shape 201 of the free layer 240, at equilibrium (zero applied field), the magnetization 242 of the free layer 240 lies substantially along the longitudinal (x axis). The direction of the magnetization 242 of the free layer 240 may be switched by providing an applied (external) field along the x axis or a combination of fields along the x and y axes. Furthermore, the free layer 240 is subject to a hard axis bias field along the y axis (perpendicular to the plane of the page in FIG. 2) due to the magnetic bias structure 260. Consequently, switching characteristics may be improved and write current reduced, as discussed below. In addition, because the magnetic bias structure 260 is in closer proximity to the free layer 240, the characteristics of the magnetic element 200 may be further improved. Processing is also simplified through the use of pinning layers 210 and 280 having different blocking temperatures.

Figure 6:
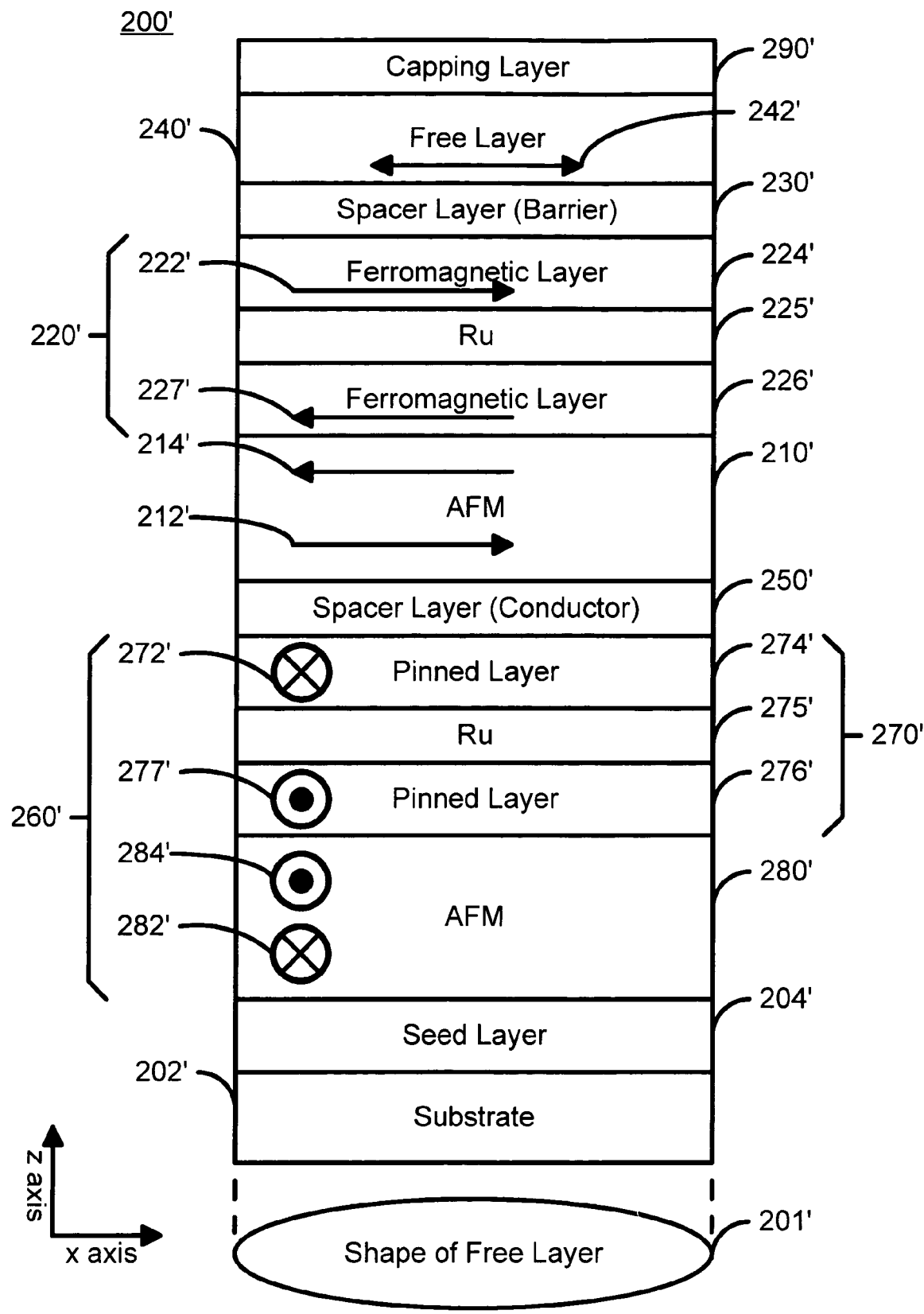
FIG. 6 is a diagram of another embodiment of a magnetic element in accordance with the present invention having improved switching characteristics.

FIG. 6 is a diagram of another embodiment of a magnetic element 200' in accordance with the present invention having improved switching characteristics. The magnetic element 200' is analogous to the magnetic element 200. Consequently, analogous portions of the magnetic element 200' are labeled similarly. The magnetic element 200' has a shape 201' having a longitudinal axis in the x direction, and a transverse axis in the y direction (out of the plane of the page). The shape 201' is preferably elliptical, but may vary. The magnetic element 200' on a substrate 202' includes a seed layer 204', a pinning layer 210' that is preferably an AFM layer, pinned layer 220', spacer layer 230' that is preferably a tunneling barrier layer, a free layer 240', a spacer layer 250' that may be conductive or a tunneling barrier layer, a magnetic bias structure 260', and capping layer 290'. However, in the magnetic element 200', the magnetic bias structure 260' resides closer to the substrate 202'.

Thus, the magnetic element 200' shares many of the benefits of the magnetic element 200. Consequently, switching characteristics may be improved, write current reduced, and processing simplified.

Figure 7:
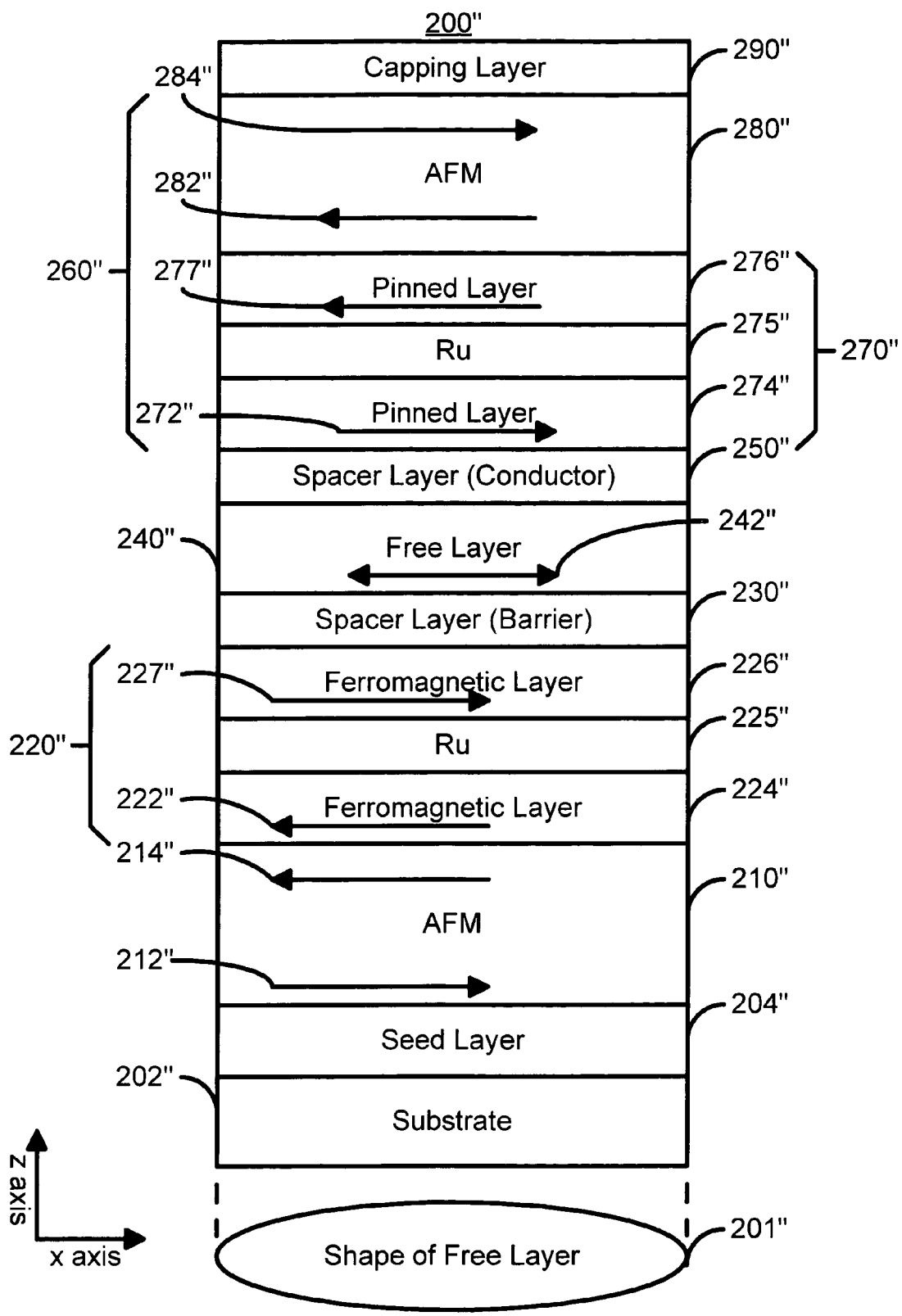
FIG. 7 is a diagram of another embodiment of a magnetic element in accordance with the present invention having improved switching characteristics.
Figure 8:
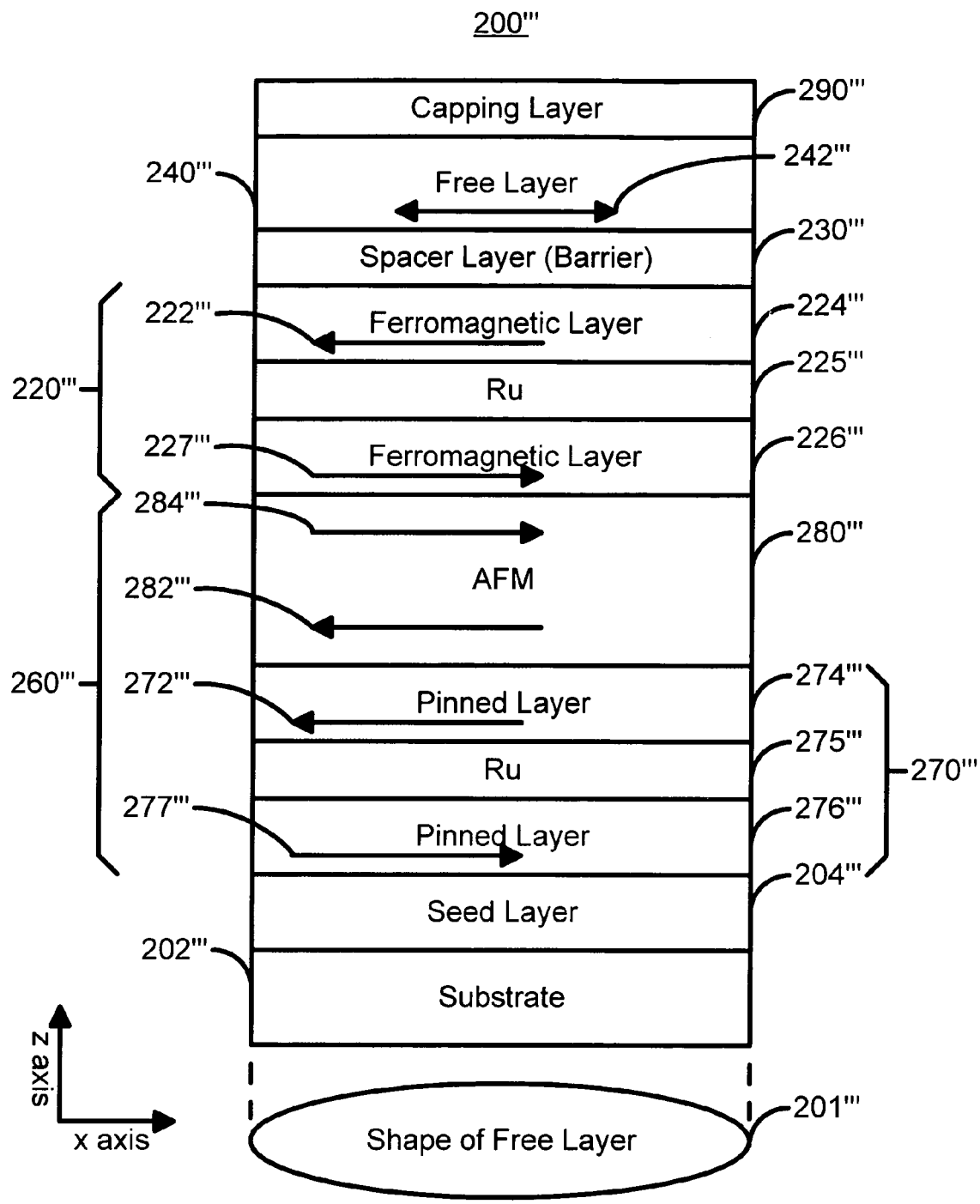
FIG. 8 is a diagram of another embodiment of a magnetic element in accordance with the present invention having improved switching characteristics.

FIGS. 7 and 8 depict other embodiments of magnetic elements 200" and 200''', respectively, in accordance with the present invention. The magnetic elements 200" and 200''' are analogous to the magnetic elements 200 and 200', respectively. Consequently, analogous portions of the magnetic elements 200" and 200''' are labeled similarly. The magnetic elements 200" and 200''' have shapes 201" and 201''', respectively, a longitudinal axis in the x direction, and a transverse axis in the y direction (out of the plane of the page). The shapes 201" and 201''' are preferably elliptical, but may vary. The magnetic element 200" on a substrate 202" includes a seed layer 204", a pinning layer 210" that is preferably an AFM layer, pinned layer 220", spacer layer 230" that is preferably a tunneling barrier layer, a free layer 240", a spacer layer 250" that may be conductive or a tunneling barrier layer, a magnetic bias structure 260", and capping layer 290". Similarly, the magnetic element 200''' on a substrate 202''' includes a seed layer 204''', pinned layer 220''', spacer layer 230''' that is preferably a tunneling barrier layer, a free layer 240''', a magnetic bias structure 260''', and capping layer 290'''. However, in the magnetic element 200''', the magnetic bias structure 260''' resides closer to the substrate 202'''. Moreover, the pinning layer 280''' for the magnetic bias structure 260''' is used to pin the magnetization 227''' of the layer 226''' for the pinned layer 220'''. Consequently, layers 210" and 250", as depicted in FIG. 7, are omitted. However, in an alternate embodiment (not shown), the layers 210" and 250" could be included between the layers 226''' and 280'''. In addition, as with the magnetic elements 200 and 200', the free layer 240" and 240''', respectively, are each substantially free of exchange coupling with the pinned layers. However, the bias structures 260" and 260''' provide a magnetic bias for the free layer 240" and 240''', respectively, that is along the easy (longitudinal) axis of the magnetic elements 200" and 200''', rather than along the hard axis. Thus, the magnetic elements 200" and 200''' are preferably used for magnetic memories in which toggle writing is to be employed. Consequently, the magnetic elements 200" and 200''' may still have improved switching characteristics and may be switched at a lower write current.

Figure 9:
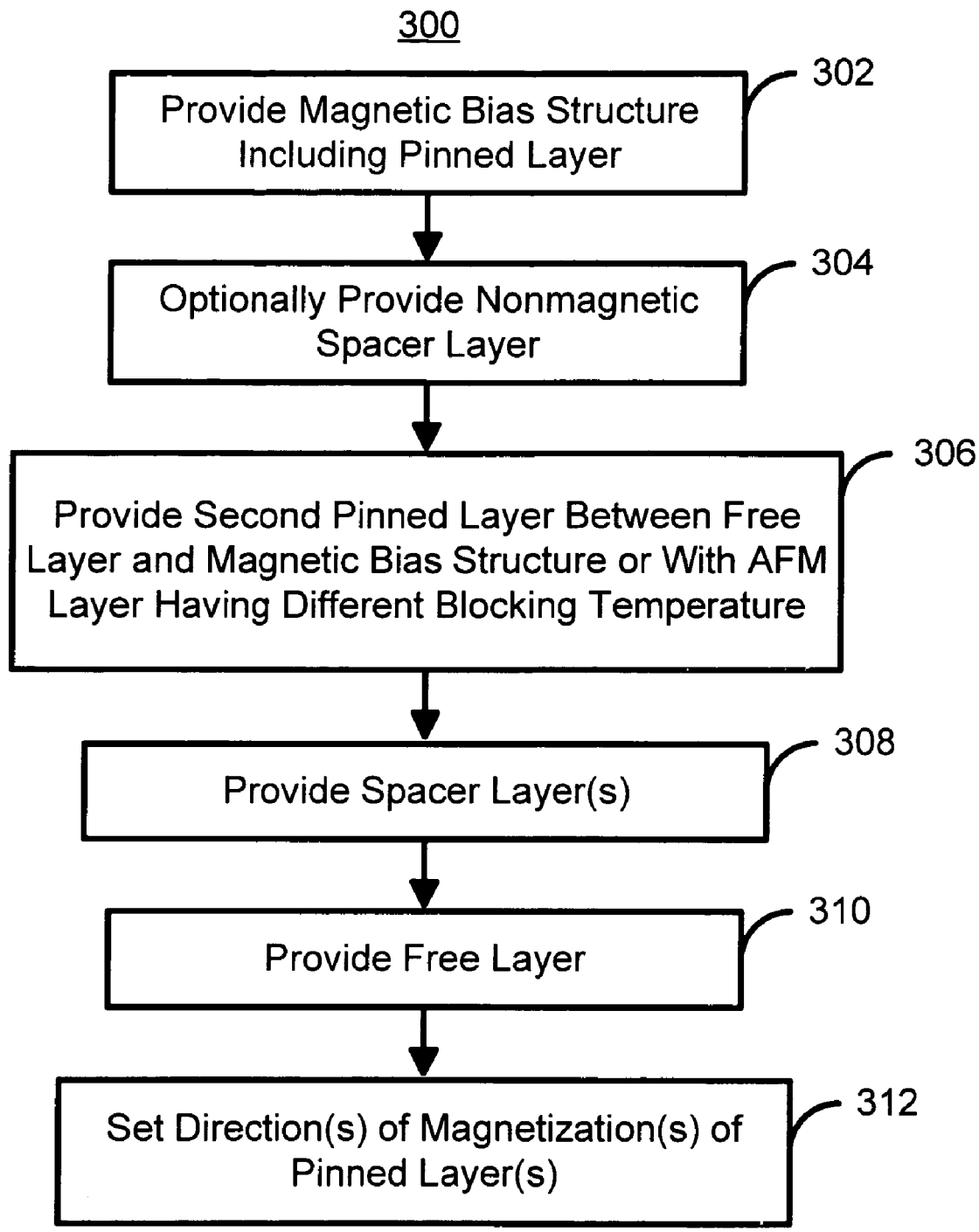
FIG. 9 is a flow chart depicting one embodiment of a method for providing a magnetic element in accordance with the present invention having improved switching characteristics.

FIG. 9 is a flow chart depicting one embodiment of a method 300 for providing a magnetic element 100, 100', and 200' in accordance with the present invention having improved switching characteristics. For simplicity some steps have been omitted. In addition, steps may be performed in a different order and/or omitted. The magnetic bias structure 110, 110', 260' is fabricated, via step 302. Step 302 may include setting the direction of magnetization for the pinning layer 112, 112', and 280'. The nonmagnetic spacer layer 130 or 130' may then be fabricated, where appropriate, via step 304. The pinned layer 140, 140', 220' may then be provided, via step 306. Step 306 may include depositing the underlying pinning layer 210', where appropriate. The spacer layer 150, 150', 230 and/or 230' may then be provided, via step 308. The free layer 160, 160', 240' are fabricated, via step 310. The magnetization directions may then be set and other processing completed, via step 312.

The steps taken to perform the alignment of the magnetizations in the desired directions in step 312 vary depending upon the magnetic element 100, 100', 200, and 200'. For the magnetic elements 200 and 200', the different blocking temperatures of the pinning layers 210 and 280 and the pinning layers 210' and 280' may be exploited. In a preferred embodiment, the pinning layers 280/280' have a lower blocking temperature than the blocking layers 210/210'. In such an embodiment, a high temperature anneal (well above the blocking temperature of the pinning layers 280 and 280') and a field in the desired direction are applied in step 312. An example of such an anneal is an anneal at greater than one Tesla and a temperature of at least 250 decrees Celsius is used to set sublattices 212/212' and 214/214'. The magnetic element 200/200' is cooled. A lower temperature, lower field is used to set the directions of the pinning layers 280 and 280'. For example, an anneal at two hundred degrees Celsius in a field of one thousand Oe may be used to set the directions of the sublattices in the pinning layers 280 and 280'. Thus, the directions of the sublattices 282/282' and 284/284' are set. However, in an alternate embodiment in which the blocking temperatures are substantially the same, the sublattices 212/212' and 214/214' may be set at the same temperature rate. In addition, for a magnetic memory in which toggle writing is used to program data to the memory, the magnetic field used in step 312 is preferably set along the easy axis of the free layer, for example along the longitudinal axis (the x axis in FIGS. 4-5).

In one embodiment, the spin flop phenomenon is exploited in order to achieve the desired orientations of the magnetizations 122, 122', 142, 142', and 192. In such an embodiment, a high external field is applied during an anneal in step 312 to achieve the magnetization orientations of pinned layers 120, 120', 140, 140', and 190. The required field and angle are determined prior to performing this anneal. The required field magnitude and angle may be determined by minimization of the total energy density of the magnetic element 100 or 100'. The total energy density includes the Zeeman energy in the external field, the interlayer exchange coupling and the magnetostatic coupling between the pinned layers 120, 140, 120', 140', and 190. In this analysis, the free layer 160/160' may be excluded from consideration because for typical aspect ratio and size of the magnetic element 100/100', the free layer 160/160' has a relatively small coercivity. The magnetization 162/162' of the free layer 160/160' is, therefore, aligned with the applied field during the anneal. Thus, the free layer 160/160' contributes constant term to the total energy. The minimization of the total energy density may be performed by numerical calculations for individual magnetic elements 100/100' having certain dimensions. Thus, the magnitude and angle of the magnetic field applied during annealing to obtain the desired orientations of the magnetizations 122, 122', 142, 142', and 192 may be determined.

Figure 10:
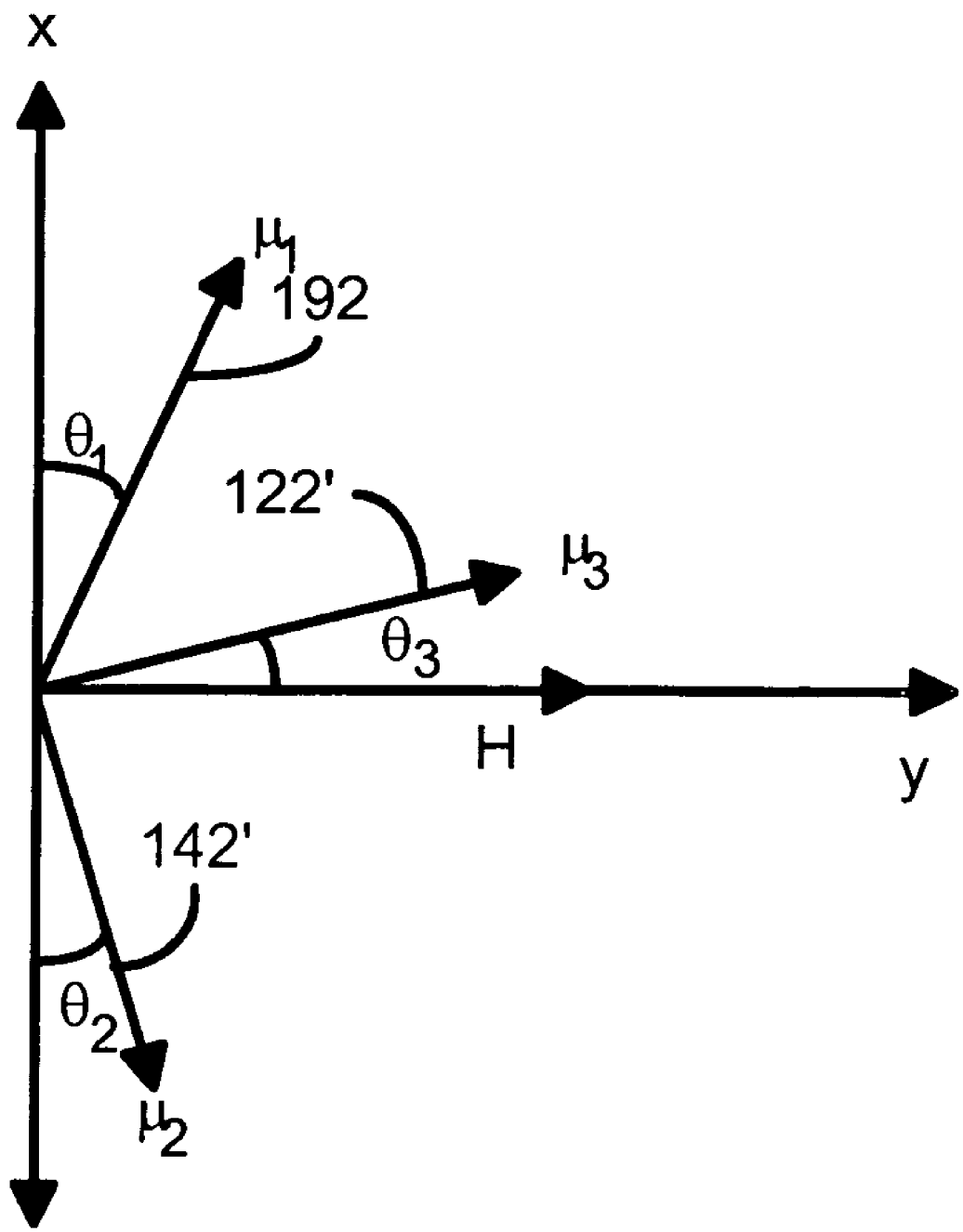
FIG. 10 is a graph depicting the orientation of the magnetization of layers used in a magnetic element in accordance with the present invention having improved switching characteristics.

For example, the magnitude and direction of the magnetic field applied during annealing may be estimated for the magnetic element 100'. For this estimation, the field direction is assumed to be as depicted in FIG. 10, which is a graph depicting the orientation of the field used in providing a magnetic element in accordance with the present invention having improved switching characteristics, as well as the magnetizations of magnetic layers 192, 142', and 122'. As can be seen in FIG. 10, the external field is applied during the anneal along the y axis. The angles $\theta_1$, $\theta_2$, and $\theta_3$ between the magnetization 192 of the pinned layer 190, the magnetization 142' of the pinned layer 140', and the magnetization 122' of the pinned layer 120' and the corresponding axes as shown on FIG. 10 are considered to be small. Note that this assumption is made to obtain a simple analytical solution of the problem using a Taylor series expansion. However, the assumption is only valid for a limited range of external field magnitude and is used for exemplary purposes only. It is also assumed that the magnetostatic interaction between the pinned layers 120', 140', and 190 is very small compared to the exchange coupling.

Based on the above assumptions, the total surface energy density of the magnetic element 100' is the sum of Zeeman energy density and exchange energy density for three pinned layers and is given by:

$$E = -\mu_3 H \cos\theta_3 - \mu_1 H \sin\theta_1 - \mu_2 H \sin\theta_2 - \sigma_{12}\cos(\theta_1 + \theta_2) + \sigma_{23}\sin(\theta_3 - \theta_2) - \sigma_{3AF}\cos\theta_3$$

Where $\mu_1$, $\mu_2$, $\mu_3$ are surface magnetization of the pinned layers 190, 140', and 120', respectively defined as $\mu_i = M_{Si} t_i$ where $M_{Si}$ is the saturation magnetization and $t_i$ is the thickness of layer i (i=1, 2, or 3 for layers 190, 140', 120' respectively), H is the magnitude of the applied field, $\sigma_{12}$, $\sigma_{23}$, and $\sigma_{3AF}$ are the exchange coupling strength between layers 190 and 140', 140' and 120', and 120' and 112', respectively. Minimization of the energy density with respect to magnetization angles $\theta_1$, $\theta_2$, and $\theta_3$ gives the following result:

$$\theta_1 \approx \frac{\mu_1}{\mu_1 - \mu_2} \frac{\sigma_{23}}{\sigma_{12}} + \frac{\sigma_{23}}{\frac{\mu_3}{\mu_1 - \mu_2}\sigma_{23} + \sigma_{3AF}}$$

$$\theta_2 \approx \theta_3 \approx -\frac{\sigma_{23}}{\frac{\mu_3}{\mu_1 - \mu_2}\sigma_{23} + \sigma_{3AF}}$$

if the value of the field magnitude is taken as $$H = \frac{\sigma_{23}}{\mu_1 - \mu_2}$$

From this simple analysis it can be deduced that the exchange coupling strength $\sigma_{23}$ must be taken rather small (much smaller than $\sigma_{12}$, $\sigma_{3AF}$) to minimize the equilibrium angles $\theta_1$, $\theta_2$, and $\theta_3$, thus creating the required pinned layer configuration.

Another consideration used in determining the material to be used for the layers 120, 120', 140, 140', 160, 160', and 190 is the value of the desired magnetostatic field in the free layer 160/160' due to the pinned layer structure (120 and 140; or 120, 140', and 190) for optimal performance. If a symmetric hysteresis loop is desired, the magnetostatic field in the free layer 160' is along the in-plane hard axis (e.g. perpendicular to the plane of the page in FIG. 3). Thus, the magnetostatic fields due to layers 140' and 190, both of which introduce easy-axis field in the free layer 160' in the opposite directions, compensate for each other. This restricts the relative values of $\mu_1$ and $\mu_2$ and, therefore, the values of the layer thicknesses if the materials of the layers are the same. The hard axis field in the free layer 160' is thus mostly due to the pinned layer 120'. To optimize the magnetic element 100' performance this field should be of the order of 20-40 Oe depending on the size and aspect ratio of the magnetic element 100'. Thus, this last condition specifies the desired value of $\mu_3$. Note that other techniques for obtaining desired pinned layer magnetic configuration exist. For example a quadratic interlayer coupling between ferromagnetic layers in the pinned layer structures can be used.

Thus, using the method 300, the magnetic elements 100, 100', 200, and 200' may be fabricated. The magnetic elements 100, 100', 200, and 200' have improved switching characteristics and a lower required write current. First, the magnetic elements 100, 100', 200, and 200' have more uniform and reliable switching due to a well defined initial state. The improved switching characteristics of the magnetic elements 100, 100', 200, and 200' can be seen using FIGS. 11-13.

Figure 11:
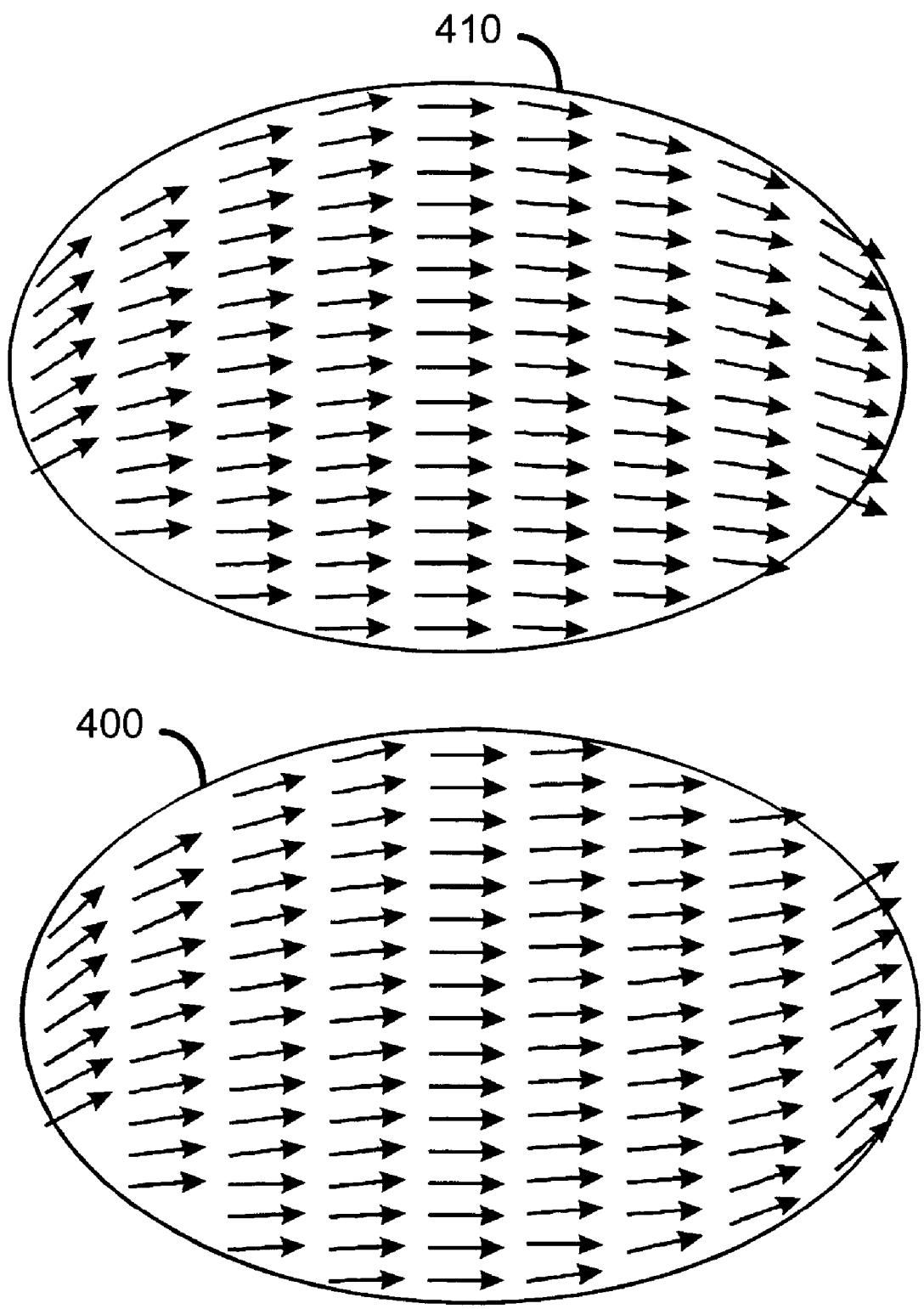
FIG. 11 is a diagram depicting possible equilibrium magnetization states of free layers having an elliptical shape.

FIG. 11 depicts possible equilibrium states 400 and 410 of free layers having an elliptical shape. For the C-state 410, switching is achieved by vortex formation, motion and annihilation creating complicated domain structure. This switching mechanism 410 results in a higher required write field and a higher distribution of the switching current. Moreover, this switching mechanism depends on shape defects or material variations due to fabrication process, thereby creating non-uniform switching threshold over the wafer. In contrast, if the free layer 160, 160', 240, or 240' is in the S-state 400, switching of the magnetization direction is achieved via coherent magnetization rotation. Consequently, a lower required write field and a lower distribution in required write field are achieved. If the initial magnetization state, S-state 400 or C-state 410, is not defined for cells in a magnetic memory, different cells may have different configurations. Consequently, large variations in required write fields occur, as in a magnetic memory using conventional magnetic elements 10/10'.

The magnetic elements 100, 100', 200, and 200' have a well defined initial magnetization state that is the S-state 400. In particular, due to the hard axis bias of the free layer 160, 160', 240, and 240' provided by magnetic bias structures 110, 110', 260, 260', respectively, the energy of the S-state 400 is lowered. Thus, the free layers 160, 160', 240, and 240' are more likely to be initially configured in the S-state 400. Consequently, a lower switching threshold, a smaller distribution of required write fields, and more uniform switching characteristics over an array of magnetic elements 100, 100', 200, and 200' may be achieved. Thus, the use of MRAM devices for data storage application may be facilitated.

Figure 12:
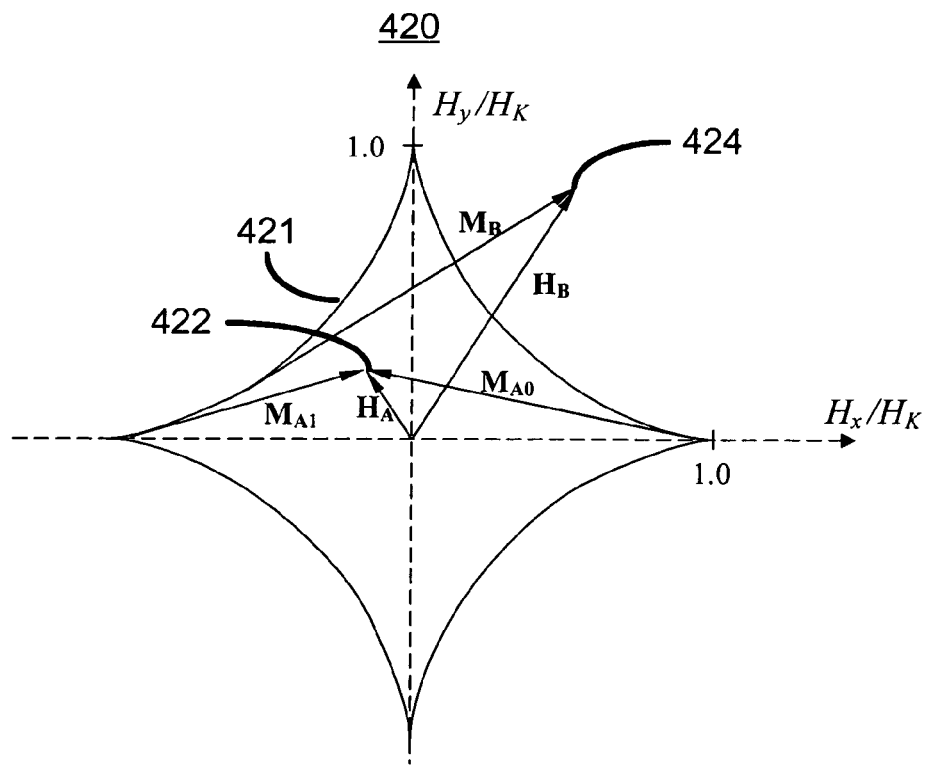
FIG. 12 is a graph depicting the magnetization of a single domain free layer in the presence of an applied field.

The magnetic elements 100, 100', 200, and 200' may also have a lower required write field and, therefore, may use a lower write current. For explanatory purposes, the required write field is determined for a Stoner-Wohlfarth model of single-domain particle with uniaxial anisotropy. The switching of such particle is often described via "switching astroid"—closed curve in ($H_x$, $H_y$) coordinate system describing the magnetization state of the cell under the influence of applied field. FIG. 12 is a graph 420 depicting the magnetization of such a particle in the presence of an applied field. Every point in ($H_x$, $H_y$) coordinate system corresponds to an applied field with these components.

When the applied field $H_A$ (field 422) is such that the point describing it is located inside the astroid 421, the magnetization of the cell can be in one of the two states: either $M_{A0}$ or $M_{A1}$ as shown in FIG. 12. In contrast, when the point corresponding to applied field is located outside the astroid (for example, field $H_B$ on FIG. 12) the magnetization can only be in one state. This can be seen as follows. The magnetization direction can be determined by taking a tangent line from the astroid to the field point as shown on FIG. 12. For fields inside the astroid, two tangent lines can be drawn corresponding to two stable states at this field. For fields outside the astroid, such as the field 424, only one tangent line exists. Consequently, only one stable magnetization state is possible. Thus, in order to switch the magnetization of the cell, it is necessary for the applied field to cross the astroid, otherwise the magnetization will return to the same state it was before the application of the field after the field is removed.

As can be seen from FIG. 12 the required write field is a strong function of direction. The required write field is the highest along the easy or hard axis (x or y axis respectively) and lowest when the field is applied at forty-five degree angle to the easy axis. Application of a constant field along the hard axis introduced in this invention is equivalent to shifting the whole astroid.

Figure 13:
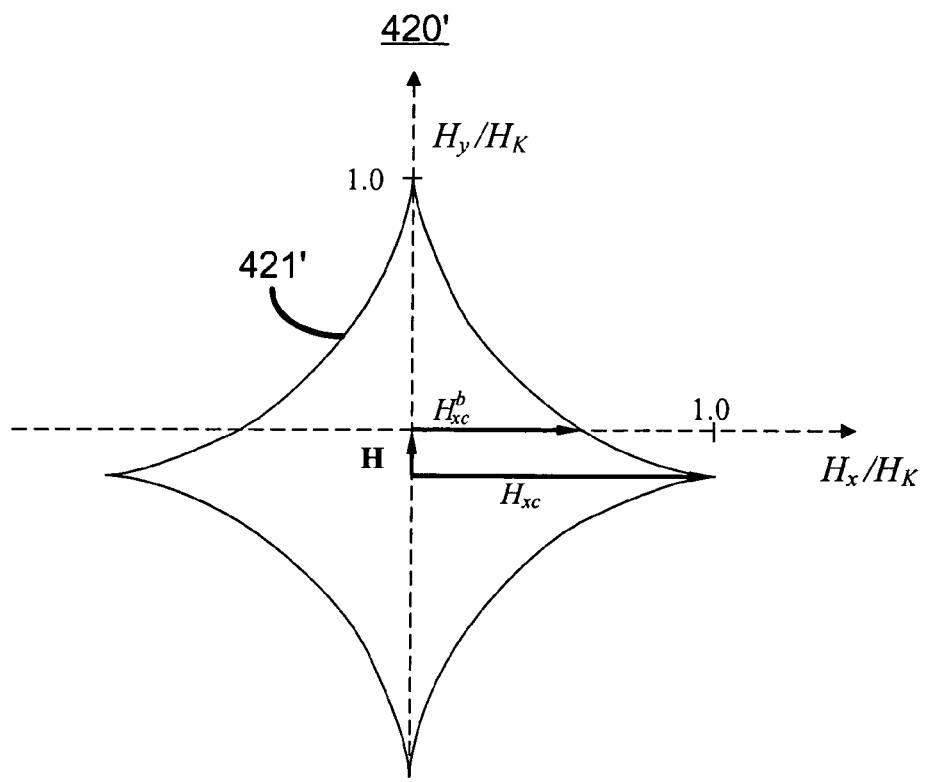
FIG. 13 is a graph depicting the magnetization of a single domain free layer in the presence of a constant applied field.

FIG. 13 is a graph 420' depicting the magnetization of a particle in the presence of a constant applied field. The astroid 421' of graph 420' has been shifted down, resulting in decreased required write field in all directions with positive y component. Lower required write field means the switching current is lower, decreasing power consumption of the device. Thus, application of the constant hard axis bias field by the magnetic bias structures 110, 110', 260, and 260' result in a lower switching current.

For example, the switching threshold along the easy axis for biased MRAM is given by:

$$H_{xc}^b = H_K \left[ 1 - \left(\frac{H}{H_K}\right)^{2/3} \right]^{3/2}$$

In contrast, the switching threshold for an unbiased magnetic element 10/10' is $H_{xc} = H_K$, where $H_K$ is the effective anisotropy field of the cell, and H is the applied hard-axis field. It is seen that even application of rather small hard-axis field results in large decrease in the switching current.

Figure 14:
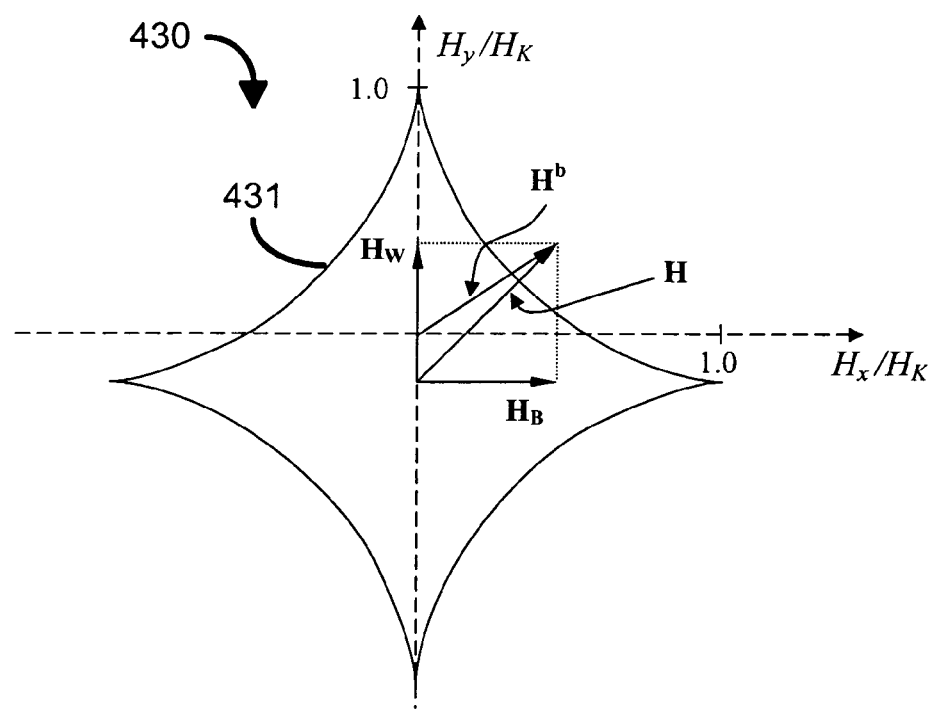
FIG. 14 is a graph depicting the magnetization of a particle in the presence of two orthogonal applied fields.
Figure 14:
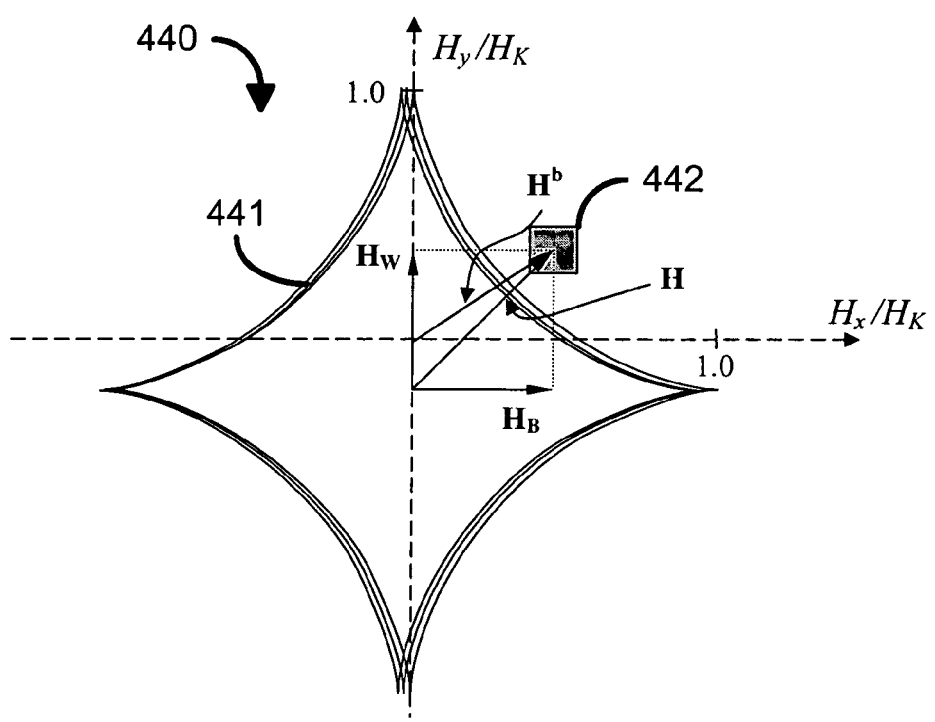

Furthermore, in MRAM recording data, or switching, is generally performed by applying a field at approximately forty-five degrees to the easy axis of the magnetic element. This is achieved by simultaneous application of two magnetic fields, as described previously. FIG. 14 includes graphs 430 and 440 depicting the magnetization of a particle in the presence of two orthogonal applied fields. The resultant fields are outside of the astroids 431 and 441 of the free layer in order to program the magnetic element. In addition, the fields due to each line stay within the astroid to prevent the undesired switching of half-selected bits, which experience only one of the fields, in MRAM array. In such switching mode, the present invention results in decrease of the required write field from H in graph 430 to $H^b$.

The astroids 421, 421', and 431 in graphs 420, 420' and 430 correspond to an idealized single-domain particle rotating coherently. In reality, however, the astroid shape and size is a strong function of the shape of the element, material parameters, as well as other factors. Consequently, the astroid shape varies within an MRAM array. Graph 440 depicts a distribution of astroids 441 for an MRAM array formed using the magnetic elements 100, 100', 200, and/or 200'. The graph 440 can be used to determine the optimal operating window 442 for the MRAM array. The use of the optimal operating window 442 ensures that the application of one field does not switch the cells with the smallest values of effective anisotropy field, whereas application of both fields switches the cells with highest values of anisotropy. In this case, the optimal required write field for biased MRAM is again smaller than for a conventional magnetic element ($H^b$ vs. H). In addition, the well-defined initial magnetization configuration (e.g. the S-state 400 described above) results in smaller distribution in switching astroids over the MRAM array. Consequently, the requirements for determining the operating window 442 are relaxed. Thus, use of the magnetic elements 100, 100', 200, and 200' may result in a lower current being used for an entire MRAM array.

Although the application of the hard axis bias field improves switching characteristics and lowers the required write current, one of ordinary skill in the art will recognize that there may be consequences of using a hard axis bias field that should be accounted for. In particular, application of the hard axis bias field, in the absence of anything else, may adversely impact the thermal stability of the magnetic element 100, 100', 200, and 200'. However, an increase in the thickness of the free layer 160, 160', 240, and 240', respectively, addresses this issue.

The effect of the increase in thickness of the free layer 160, 160', 240, and 240' on thermal stability can be explained as follows. When the hard axis bias field, $H_y$, is applied to the free layer having shape anisotropy field $H_K$ the thermal stability of the free layer is decreased according to the expression:

$$\Delta(H_y) = \frac{\mu_0 M_S H_K A t}{2 k_B T} \left(1 - \frac{H_y}{H_K}\right)^2$$

where A and t are the area and thickness, respectively, of the free layer 160, 160', 240, or 240', and T is operating temperature of the device. Thus, the term due to the applied field, $(1-H_y/H_k)^2$ decreases the thermal stability. One way to compensate for this decrease of thermal stability is to increase the thickness, t, of the free layer 160, 160', 240, or 240'. The increase in t increases both the volume of the free layer 160, 160', 240, or 240' and the anisotropy field $H_K$. In order to obtain simple analytical expression for the thickness increase required to balance the thermal stability decrease due to the hard axis bias field, it is assumed that $H_K$ is proportional to t, which is reasonable for thicknesses of the free layer much smaller than the in-plane size. The requirement of the thermal stability for the biased free layer and the unbiased free layers to be the same can be expressed as $$\frac{\mu_0 M_S H_{K0} t^2 A}{2 k_B T t_0} \left(1 - \frac{H_y}{H_{K0}} \frac{t_0}{t}\right)^2 = \frac{\mu_0 M_S H_{K0} t_0 A}{2 k_B T}$$

where $t_0$ and $H_{K0}$ are the thickness and anisotropy field of the unbiased free layer. This condition gives the following equation to determine the required increase in free layer thickness:

$$\tau^2 \left(1 - \frac{h_y}{\tau}\right)^2 = 1$$

where $\tau = t/t_0$ and $h_y = H_y/H_{K0}$. Solving for $\tau$ results in:

$$\tau = h_y + 1 \quad \text{or} \quad t = t_0 \left(\frac{H_y}{H_{K0}} + 1\right)$$

A free layer with thickness t will have the same thermal stability as the unbiased free layer with thickness $t_0$. The change in the required write field for hard axis biased free layer with increased thickness to maintain the thermal stability can be found from the switching astroid equation:

$$H_x(H_y) = H_K \left(1 - \left(\frac{H_y}{H_K}\right)^{2/3}\right)^{3/2}$$

where the anisotropy field of the hard axis biased free layer 160, 160', 240, and 240' with increased thickness is related to the anisotropy field of unbiased free layer with thickness $t_0$ as follows:

$$H_K = \frac{t}{t_0} H_{K0} = \tau H_{K0}$$

Consequently, the required write field for a biased free layer 160, 160', 240, or 240' can be written:

$$H_x(H_y) = H_{K0} \left[\left(\frac{H_y}{H_{K0}} + 1\right)^{2/3} - \left(\frac{H_y}{H_{K0}}\right)^{2/3}\right]^{3/2}$$

Figure 15:
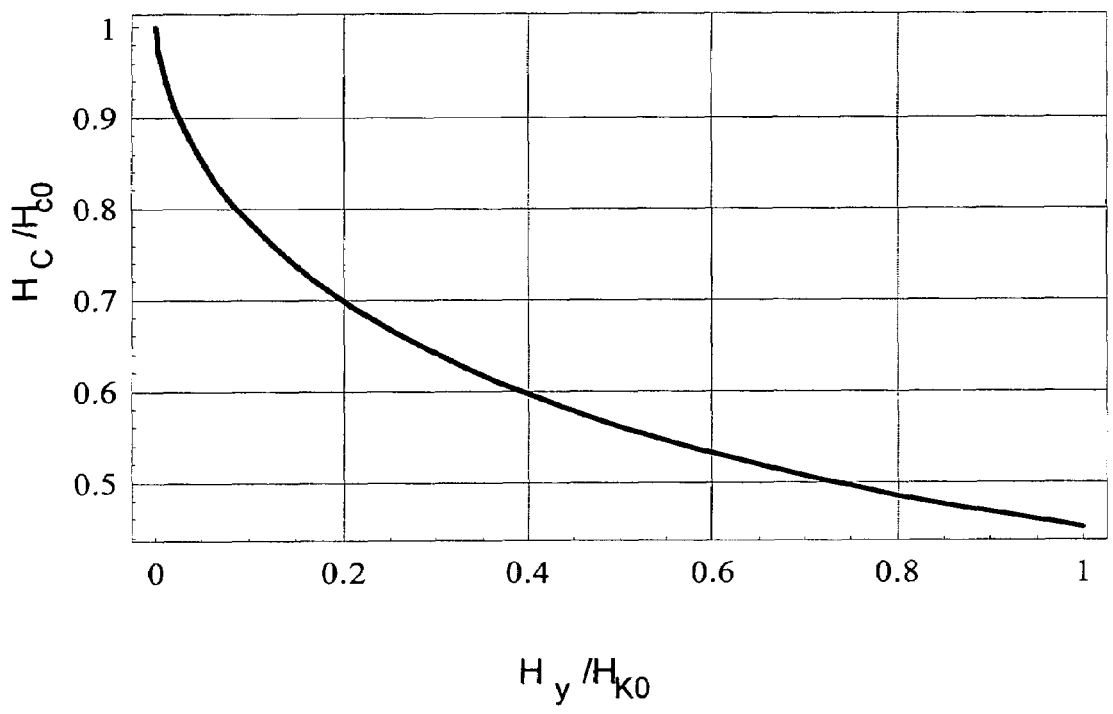
FIG. 15 is a diagram depicting the dependence of coercivity of the free layer formed in accordance with the present invention on the applied hard-axis field.

Consequently, the coercivity of the free layer is:

$$H_c(H_y) = H_{c0} \left[\left(\frac{H_y}{H_{K0}} + 1\right)^{2/3} - \left(\frac{H_y}{H_{K0}}\right)^{2/3}\right]^{3/2}$$

where $H_{c0}$ is the coercivity of the unbiased free layer. This coercivity is related to the anisotropy field by Sharrock's formula:

$$H_{c0} = H_{K0} \left[1 - \sqrt{\frac{1}{\Delta} \log \frac{f_0 t_p}{\log 2}}\right] \quad (10)$$

where $f_0$ is the activation frequency, $t_p$ is the required write field pulse width. The results of this are drawn in the graph 450 of FIG. 15. Thus application of hard-axis field causes large decrease in required write field with the same thermal factor, e.g. for $H_y = 0.4 H_{K0}$ the coercivity is decreased by 40% to 0.6 $H_{c0}$.

A method and system for providing a magnetic element that has improved switching characteristics and a reduced required write current have been disclosed. The present invention has been described in accordance with the embodiments shown, and one of ordinary skill in the art will readily recognize that there could be variations to the embodiments, and any variations would be within the spirit and scope of the present invention. Accordingly, many modifications may be made by one of ordinary skill in the art without departing from the spirit and scope of the appended claims.

We claim:

1. A magnetic element comprising:
 a magnetic biasing structure including a first pinned layer having a first pinned layer magnetization pinned in a first direction;
 a second pinned layer having a second pinned layer magnetization oriented in a second direction substantially perpendicular to the first direction;
 a spacer layer, the spacer layer being nonferromagnetic; and
 a free layer, the spacer layer residing between the second pinned layer and the free layer, the second pinned layer residing between the free layer and the first pinned layer, the spacer layer being configured such that the free layer is substantially free of exchange coupling with the second pinned layer, the free layer having a shape anisotropy with a longitudinal direction substantially parallel to the second direction, the magnetic biasing structure for providing a bias field for the free layer along the first direction.

2. The magnetic element of claim 1 wherein the bias field provided by the magnetic biasing structure is a hard axis bias field along the first direction.

3. The magnetic element of claim 1 wherein
the magnetic biasing structure includes a nonferromagnetic spacer layer having a nonferromagnetic spacer layer thickness, the nonferromagnetic spacer layer residing between the first pinned layer and the second pinned layer, the second pinned layer magnetization being magnetically coupled with first pinned layer magnetization, the nonferromagnetic spacer layer thickness being configured such that the second direction is substantially perpendicular to the first direction.

4. The magnetic element of claim 3 wherein the magnetic biasing structure further includes a pinning layer adjacent to the first pinned layer, the pinning layer for pinning the first pinned layer magnetization in the first direction.

5. The magnetic element of claim 4 wherein the pinning layer is an antiferromagnetic layer having a first magnetic sublattice oriented substantially parallel to the first direction and a second magnetic sublattice oriented substantially antiparallel to the first direction.

6. The magnetic element of claim 3 wherein the nonmagnetic spacer layer includes Ru.

7. The magnetic element of claim 3 wherein the spacer layer is a conductive layer.

8. The magnetic element of claim 3 wherein the spacer layer is a tunneling barrier layer.

9. The magnetic element of claim 3 wherein the first pinned layer, the second pinned layer, and the free layer each include at least one of Co, Permalloy, and a CoFe alloy.

10. The magnetic element of claim 1 wherein the free layer is characterized by an initial state in the absence of an external magnetic field, the initial state being an S-state.

11. A method for providing a magnetic element comprising:
providing a magnetic biasing structure including a first pinned layer having a first pinned layer magnetization pinned in a first direction;
providing a second pinned layer having a second pinned layer magnetization oriented in a second direction substantially perpendicular to the first direction;
providing a spacer layer, the spacer layer being nonferromagnetic;
providing a free layer, the spacer layer residing between the second pinned layer and the free layer, the second pinned layer residing between the first pinned layer and the free layer, the spacer layer being configured such that the free layer is substantially free of exchange coupling with the second pinned layer, the free layer having a shape anisotropy with a longitudinal direction substantially parallel to the second direction, the magnetic biasing structure for providing a hard axis bias field for the free layer along the first direction; and
setting the first direction and the second direction, the direction setting capable of including performing a first anneal at a first temperature with a first magnetic field in the first direction and performing a second anneal at a second temperature with a second magnetic field in the second direction.

12. The method of claim 11 wherein the bias field provided by the magnetic biasing structure is a hard axis bias field along the first direction.

13. The method of claim 11 wherein the magnetic biasing structure providing step further includes:
providing a nonferromagnetic spacer layer having a nonferromagnetic spacer layer thickness, the nonferromagnetic spacer layer residing between the first pinned layer and the second pinned layer, the second pinned layer magnetization being magnetically coupled with first pinned layer magnetization, the nonferromagnetic spacer layer thickness being configured such that the second direction is substantially perpendicular to the first direction.

14. The method of claim 13 wherein the magnetic biasing structure providing step further includes:
providing a pinning layer adjacent to the first pinned layer, the pinning layer for pinning the first pinned layer magnetization in the first direction.

15. The method of claim 14 wherein the pinning layer providing further includes:
providing an antiferromagnetic layer having a first magnetic sublattice oriented substantially parallel to the first direction and a second magnetic sublattice oriented substantially antiparallel to the first direction.

16. The method of claim 13 wherein the nonmagnetic spacer layer providing further includes:
providing a Ru layer.

17. The method of claim 13 wherein the spacer layer providing further includes:
providing a conductive layer.

18. The method of claim 13 wherein the spacer layer providing further includes:
providing a tunneling barrier layer.

19. The method of claim 13 wherein the first pinned layer, the second pinned layer, and the free layer each include at least one of Go, Permalloy, and a CoFe alloy.

20. A magnetic memory comprising:
a plurality of magnetic elements, each of the plurality of magnetic elements including a biasing structure including a first pinned layer having a first pinned layer magnetization pinned in a first direction, a second pinned layer, a spacer layer, and a free layer, the second pinned layer having a second pinned layer magnetization oriented in a second direction substantially perpendicular to the first direction, the spacer layer being nonferromagnetic and residing between the second pinned layer and the free layer, the second pinned layer residing between the free layer and the first pinned layer, the spacer layer being configured such that the free layer is substantially free of exchange coupling with the second pinned layer, the free layer having a shape anisotropy with a longitudinal direction substantially parallel to the second direction, the magnetic biasing structure for providing a bias field for the free layer along the first direction.

21. The magnetic memory of claim 20 wherein the free layer is characterized by an initial state in the absence of an external magnetic field, the initial state being an S-state.

22. A magnetic element comprising:
a magnetic biasing structure including a first pinned layer having a first pinned layer magnetization pinned in a first direction;
a second pinned layer having a second pinned layer magnetization oriented in a second direction substantially perpendicular to the first direction;
a spacer layer, the spacer layer being nonferromagnetic; and
a free layer, the spacer layer residing between the second pinned layer and the free layer, the second pinned layer residing between the free layer and the first pinned layer, the spacer layer being configured such that the free layer is substantially free of exchange coupling with the second pinned layer, the free layer having an initial state in the absence of an external magnetic field, the magnetic biasing structure for providing a bias field for the free layer such that the initial state is an S-state.

23. A magnetic element comprising:

a magnetic biasing structure including a first pinned layer having a first pinned layer magnetization pinned in a first direction;

a second pinned layer having a second pinned layer magnetization oriented in a second direction substantially perpendicular to the first direction;

a spacer layer, the spacer layer being nonferromagnetic; and a free layer, the spacer layer residing between the second pinned layer and the free layer, the second pinned layer residing between the free layer and the first pinned layer, the spacer layer being configured such that the free layer is substantially free of exchange coupling with the second pinned layer, the free layer having an anisotropy with a longitudinal direction substantially parallel to the second direction, the magnetic biasing structure for providing a bias field for such than an initial state of the free layer in an absence of an external magnetic field is an S-state.

* * * * *